United States Patent
Hatano et al.

(10) Patent No.: US 7,456,428 B2
(45) Date of Patent: Nov. 25, 2008

(54) MANUFACTURING METHOD OF SEMICONDUCTOR FILM AND IMAGE DISPLAY DEVICE

(75) Inventors: Mutsuko Hatano, Tokyo (JP); Mikio Hongo, Yokohama (JP); Akio Yazaki, Tokyo (JP); Mitsuharu Tai, Tokyo (JP); Takeshi Noda, Mobara (JP); Yukio Takasaki, Kawasaki (JP)

(73) Assignee: Hitachi Displays, Ltd., Mobara-shi (JP)

( * ) Notice: Subject to any disclaimer, the term of this patent is extended or adjusted under 35 U.S.C. 154(b) by 112 days.

(21) Appl. No.: 11/711,623

(22) Filed: Feb. 28, 2007

(65) Prior Publication Data
US 2007/0155140 A1     Jul. 5, 2007

Related U.S. Application Data

(62) Division of application No. 11/007,188, filed on Dec. 9, 2004, now Pat. No. 7,202,144.

(30) Foreign Application Priority Data

Jan. 30, 2004     (JP)     ............................. 2004-022473

(51) Int. Cl.
*H01L 29/04* (2006.01)
(52) U.S. Cl. ..................... 257/64; 257/72; 257/E27.112
(58) Field of Classification Search .................. 257/64, 257/67, 70, 72, E27.112
See application file for complete search history.

(56) References Cited

U.S. PATENT DOCUMENTS

| 4,514,895 | A |   | 5/1985 | Nishimura |
|---|---|---|---|---|
| 5,432,122 | A |   | 7/1995 | Chae |
| 6,072,194 | A | * | 6/2000 | Wakita et al. ................. 257/66 |
| 6,391,690 | B2 |  | 5/2002 | Miyasaka |
| 7,109,069 | B2 | * | 9/2006 | Kokubo et al. ........ 257/E27.111 |

FOREIGN PATENT DOCUMENTS

| JP | 2003-086505 | 3/2003 |
|---|---|---|
| JP | 2003-124136 | 4/2003 |

* cited by examiner

*Primary Examiner*—Chandra Chaudhari
(74) *Attorney, Agent, or Firm*—Mattingly, Stanger, Malur & Brundidge, P.C.

(57) ABSTRACT

A semiconductor thin film is manufactured by scanning laser light or a substrate onto an arbitrary region of the semiconductor thin film and irradiating a laser thereon. The semiconductor thin film is formed by the substantially belt-shaped crystal being crystallized such that crystalline grains grow in the scanning direction, on the substrate, on XY coordinates where value x of beam size W (μm) of the laser light measured in substantially the same direction as the scanning direction is defined as X axis, and where value y of scanning velocity Vs (m/s) is defined as Y axis, the crystallization processing is performed within a region where all of the following conditions hold: condition 1: the beam size W is larger than wavelength of the laser beam, condition 2: the scanning velocity Vs is smaller than upper-limit of crystal growth speed, and condition 3: x×(1/y)<25 μs.

5 Claims, 24 Drawing Sheets

COMPARISON AMONG CRYSTAL MODES

FIG. 13A
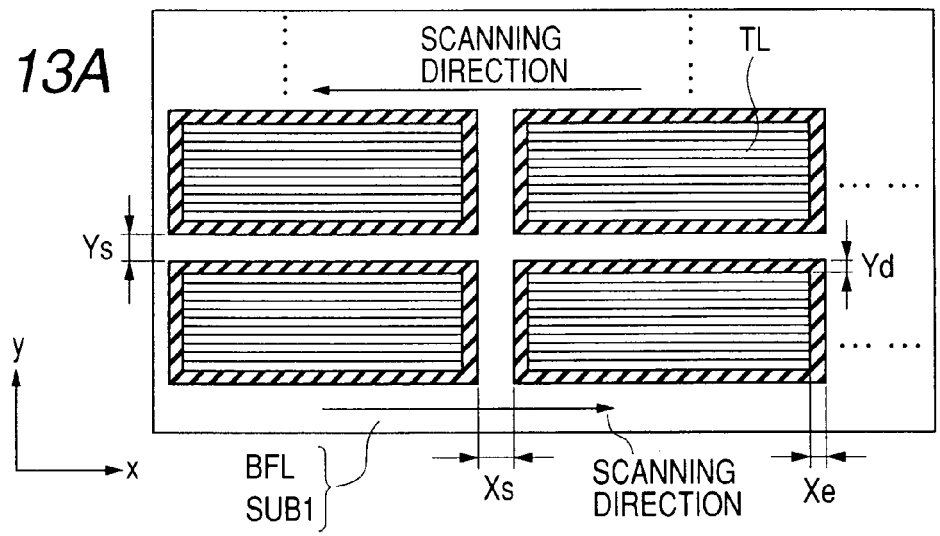
FIG. 13B
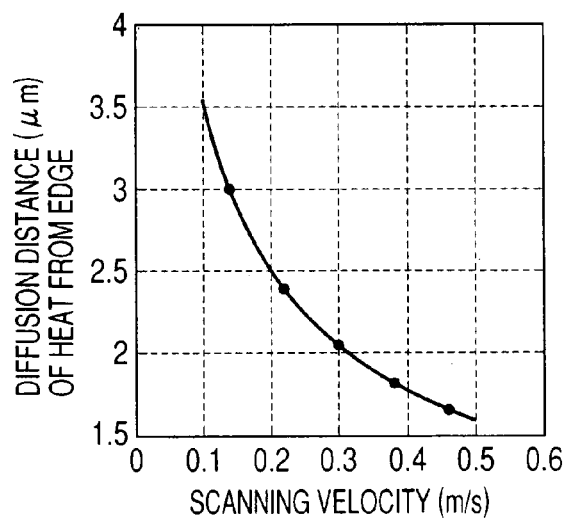
FIG. 13C
| | POWER | SCANNING VELOCITY | BEAM WIDTH |
|---|---|---|---|
| Yd | $\sqrt{\phantom{x}}$ | $1/\sqrt{\phantom{x}}$ | $\sqrt{\phantom{x}}$ |
| Xe | PROPORTIONAL | INVERSELY PROPORTIONAL | PROPORTIONAL |

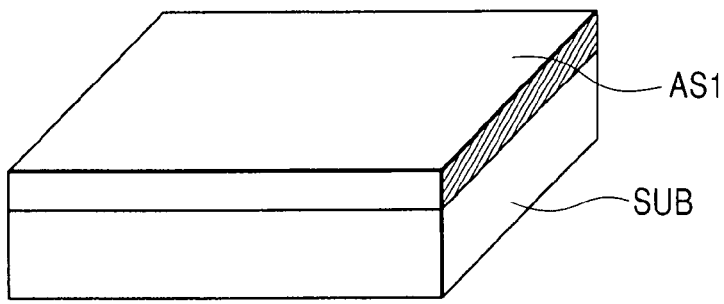
FIG. 24A
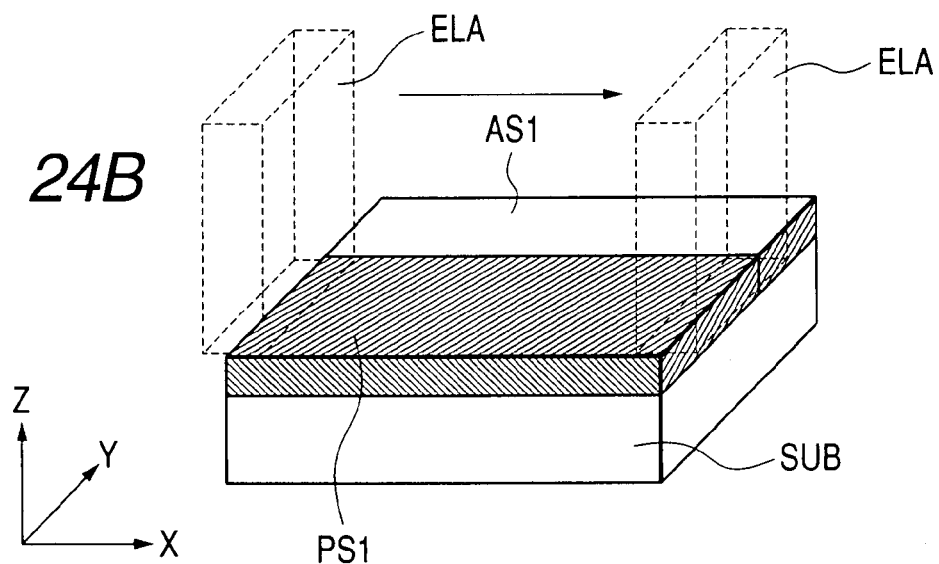
FIG. 24B
FIG. 25
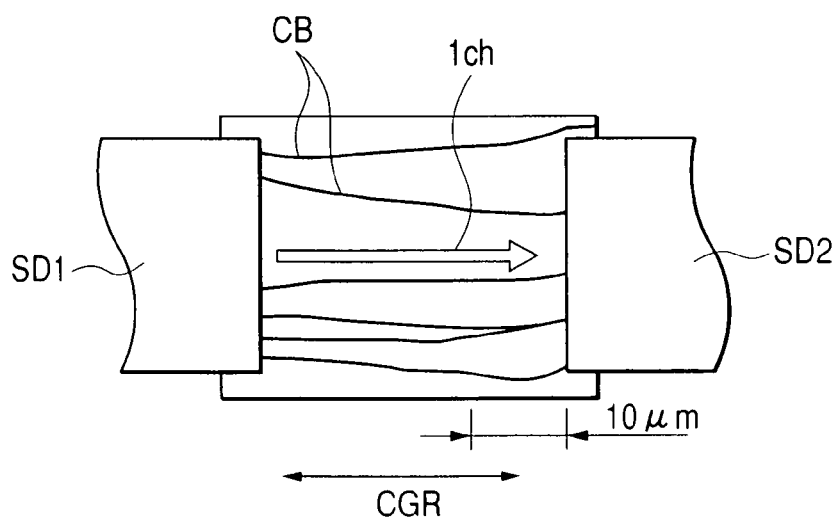

MANUFACTURING METHOD OF SEMICONDUCTOR FILM AND IMAGE DISPLAY DEVICE

This application is a divisional of U.S. patent application Ser. No. 11/007,188, filed Dec. 9, 2004, now U.S. Pat No. 7,202,144 which is incorporated by reference herein in its entirety.

INCORPORATION BY REFERENCE

The present application claims priority from Japanese application JP 2004-022473 filed on Jan. 30, 2004, the content of which is hereby incorporated. by reference into this application.

BACKGROUND OF THE INVENTION

1. Field of the Invention

The present invention relates to a manufacturing method for a semiconductor thin film, and an image display device. More particularly, it relates to a manufacturing method for acquiring a high-quality semiconductor thin film by irradiating with laser light and crystallizing a semiconductor thin film formed on an insulating substrate. Accordingly, the present invention is a one suitable for active-matrix-scheme image display devices.

2. Description of the Related Art

The active-matrix-scheme image display devices (which, otherwise, are referred to as "active-matrix-type driving scheme image display devices", or as merely "display devices") are widely used at present. In the active-matrix-scheme image display devices, active elements such as thin film transistors (TFTS) are used as driving elements for driving matrix-arranged pixels. In many of this type of image display devices, a large number of pixel circuits and driving circuits are configured with the active elements such as the thin film transistors formed using a silicon film as the semiconductor film. Moreover, these large number of circuits are located on an insulating substrate, thereby making it possible to display excellent-quality images. Here, the explanation will be given selecting, as an example of the active elements, the thin film transistors, i.e., the typical example thereof.

In the thin film transistors using a non-crystalline semiconductor film (amorphous semiconductor film) which has been generally used as the semiconductor film so far, there exists a limit to performances of the thin film transistors the representative of which is their carrier (electron or hole) mobility. This limit has made it difficult to configure circuits requested to exhibit high-speed and high-function performances. In order to implement thin film transistors having high mobility needed for providing superior image quality, it is effective to modify property of (i.e., crystallize) the amorphous film (hereinafter, also referred to as "non-crystalline film") to a polycrystalline film (hereinafter, also referred to as "poly-crystal film") in advance, and to form the thin film transistors by using the polycrystalline film. For implementing this property modification, a method is used which anneals the amorphous film by irradiating the amorphous film with laser light such as excimer laser light.

Referring to FIG. 24A and FIG. 24B, the explanation will be given below concerning the property modification method based on the crystallization of an amorphous-silicon film by using the excimer laser-light irradiation. FIG. 24A and FIG. 24B are explanatory diagrams for explaining the crystallization method for crystallizing an amorphous-silicon film by scanning the most common excimer pulse laser-light irradiation. FIG. 24A illustrates configuration of an insulating substrate on which the semiconductor layer to be irradiated is formed. FIG. 24B illustrates a state whose property is to be modified by the laser light irradiation. As this insulating substrate, a glass or plastic substrate is used.

In FIG. 24A and FIG. 24B, an amorphous-silicon film ASI, which has been deposited on an insulating substrate SUB via a buffer layer (SiN, $SiO_2$, or the like, not illustrated), is irradiated with about several-nm to several hundred-nm-wide line-shaped excimer laser light ELA. Then, a scanning is performed that the irradiation position is displaced on each one to several-pulse basis along one direction (X direction) as is indicated by the arrow. This scanning anneals the amorphous-silicon film ASI, thereby modifying property of the amorphous-silicon film ASI on the entire insulating substrate SUB to a polysilicon film PSI. Moreover, various machinings, such as etching, wiring formation, and ion implantation, are performed to the polysilicon film PSI acquired by the property modification in this method. This allows formation of the circuits which include active elements such as thin film transistors in each of the pixel units or driving units.

Taking advantage of this insulating substrate, the active-matrix-scheme image display devices, such as liquid-crystal display devices or organic EL display devices, are manufactured. In the conventional property modification of the amorphous-silicon film using the excimer laser light, a large number of about 0.05-µm to 0.5-µm-diameter crystallized silicon grains (i.e., polysilicon) grow at random in the laser-light-irradiated portion. The electric-field effect mobility of the TFTs formed of the polysilicon film like this is equal to about 200 $cm^2/V·s$ or less, and about 120 $cm^2/V·s$ on average.

Furthermore, as a method for acquiring the high-quality semiconductor thin film, there exists the following technology: Namely, as is disclosed in JP-A-2003-86505, a semiconductor thin film is irradiated with continuous-wave laser (CW laser) while scanning the continuous-wave laser in one direction. This irradiation grows a crystal which is continuous in the scanning direction, thereby forming the crystal which extends long in that direction. Moreover, the substrate is scanned while irradiating with the CW laser a semiconductor thin film which has been machined in advance in an island-shaped or line-shaped manner. Otherwise, a thermal gradient is given at the time of the laser annealing. These methods make it possible to acquire a crystal (hereinafter, referred to as "lateral crystal") which is flat and whose crystalline grains have grown significantly in one direction. As an example using the continuous-wave laser other than this document, there exists JP-A-2003-124136. Meanwhile, in addition to JP-A-2003-86505 and JP-A-2003-124136, there also exists a method for inducing the lateral crystal by giving a thermal gradient through irradiation of the film with the ELA via a slit or mask whose slit width is smaller than several µm. Applying the semiconductor thin film like this allows acquisition of a high-performance characteristic that the electric-field effect mobility is larger than about 300 $cm^2/V·s$.

SUMMARY OF THE INVENTION

In the conventional laser crystallization method, there have occurred the following drawbacks: Namely, when trying to form an excellent-quality and homogeneous-property semiconductor thin film on all over the surface of a large-area glass substrate used for manufacturing the image display devices, there takes place flake-off (hereinafter, referred to as "aggregation") of a part of the film due to the aggregation within liquid Si. Otherwise, the film cannot grow enough up to the lateral crystal, but granular crystals are produced instead.

These drawbacks are caused by such factors as instability or nonuniformity of the film, or instability or nonuniformity of laser irradiation conditions. In particular, if the semiconductor thin film is thin, i.e., 200 nm or less, there has existed the following problem: Namely, heat by the laser irradiation dissipates away to the substrate side, and thus solidification by cooling develops faster. As a result, a crystal nucleation produces itself spontaneously before the lateral crystal has grown largely enough. This becomes a cause which prevents the large grain from being generated. Also, there have existed the following problems: Namely, the irradiation time becomes longer, and the aggregation becomes likely to occur if laser fluence is given in excess. Moreover, the buffer layer or the substrate suffers from thermal stress or damage.

In view of the problems in the above-described prior art, the present invention has been devised. Accordingly, a first object of the present invention is to provide a manufacturing method for manufacturing a high-quality and homogeneous-property semiconductor thin film whose grain boundary and grain diameter are controllable and whose film roughness and crystal defects occurring in the process of crystallization are reduced.

A second object of the present invention is to provide a manufacturing method for manufacturing a low-price and high-quality semiconductor thin film whose manufacturing-steps number is reduced, which is easily applicable to a large-area substrate, and which exhibits a high throughput.

A third object of the present invention is to provide an image display device to which high-characteristics semiconductor thin film transistors have been applied that operate on an inexpensive insulating substrate such as glass with a high performance and high reliability, and that are excellent in uniformity among devices.

Hereinafter, examples of configuration of the present invention will be listed below.

(1), A method of manufacturing a semiconductor thin film which forms a substantially belt-shaped crystal crystallized by scanning laser light or a substrate onto an arbitrary region of the semiconductor thin film and performing a laser irradiation thereon, the substantially belt-shaped crystal being crystallized such that crystalline grains grow in the scanning direction, the semiconductor thin film being formed on the substrate, wherein, on XY coordinates where value x of beam size W ($\mu$m) of the laser light measured in substantially the same direction as the scanning direction is defined as X axis, and where value y of scanning velocity Vs (m/s) is defined as Y axis, the crystallization processing is performed within a region where all of the following (condition 1), (condition 2), and (condition 3) hold.

(condition 1) the beam size W is larger than wavelength of the laser beam (condition 2) the scanning velocity Vs is smaller than upper-limit of crystal growth speed (condition 3) x×(1/y)<25 $\mu$s (2), In (1), the beam size W is a size having light intensity which is larger than 13.5% of maximum beam light-intensity on the semiconductor thin film irradiated with a beam spot.

(3), In (1) or (2), x×(1/y)≦12.5 $\mu$s.

(4), In anyone of (1) to (3), x×(1/y)≦10 $\mu$s.

(5), In anyone of (1) to (4), the wavelength of the laser light is equal to 0.532 $\mu$m.

(6), In anyone of (1) to (5), thickness of the semiconductor thin film is smaller than 200 nm.

(7), In anyone of (1) to (6), the semiconductor thin film irradiated with the laser light is a non-crystalline silicon or a polycrystal silicon, and y<5 m/s.

(8), In anyone of (1) to (7), the laser light with which the substrate is irradiated is laser light of a continuous-wave solid laser, or is laser light resulting from time-modulating the laser light of the continuous-wave solid laser at pulse width and/or pulse interval on time basis.

(9), In anyone of (1) to (8), the laser light with which the substrate is irradiated is laser light of a continuous-wave laser, or is laser light resulting from time-modulating the continuous-wave laser at pulse width and/or pulse interval on time basis, beam length in a direction perpendicular to the scanning direction being smaller than size of the semiconductor thin film in the direction perpendicular to the scanning direction.

(10), In anyone of (1) to (8), the laser light with which the substrate is irradiated is laser light of a continuous-wave laser, or is laser light resulting from time-modulating the continuous-wave laser at pulse width and/or pulse interval on time basis, the semiconductor thin film irradiated with the laser light being machined in an island-shaped or line-shaped manner, beam length in a direction perpendicular to the scanning direction being larger than or equal to size of the semiconductor thin film machined in the island-shaped or line-shaped manner and measured in the direction perpendicular to the scanning direction.

(11), A method of manufacturing a semiconductor thin film which forms a substantially belt-shaped crystal crystallized by scanning laser light or a substrate onto an arbitrary region of the semiconductor thin film and performing a laser irradiation thereon, the substantially belt-shaped crystal being crystallized such that crystalline grains grow in the scanning direction, the semiconductor thin film being formed on the substrate, wherein, on XY coordinates where value x of duration time ts ($\mu$s) of the laser beam onto the semiconductor thin film is defined as X axis, and where value y of laser fluence (J/cm$^2$) is defined as Y axis, assuming that y>0.04x+0.1 (expression 1), x>0.1 (expression 2), y<5 (expression 3), and x<25 (expression 4), the crystallization is performed within a region surrounded by (expression 1), (expression 2), (expression 3), and (expression 4).

(12), In (11), letting beam size of the laser light measured in substantially the same direction as the scanning direction be W ($\mu$m), and letting scanning velocity be Vs (m/s), the duration time ts of the laser beam onto the semiconductor thin film=W×(1/Vs), and the beam size W is a size having light intensity which is larger than 13.5% of maximum beam light-intensity on the semiconductor thin film irradiated with a beam spot.

(13), In (11) or (12), x≦12.5.

(14), In anyone of (11) to (13), x≦10.

(15), In anyone of (11) to (14), the wavelength of the laser light is equal to 0.532 $\mu$m.

(16), In anyone of (11) to (15), thickness of the semiconductor thin film is smaller than 200 nm.

(17), In anyone of (11) to (16), the semiconductor thin film irradiated with the laser light is a non-crystalline silicon or a polycrystal silicon.

(18), In anyone of (11) to (17), the laser light with which the substrate is irradiated is laser light of a continuous-wave solid laser, or is laser light resulting from time-modulating the laser light of the continuous-wave solid laser at pulse width and/or pulse interval on time basis.

(19), In anyone of (11) to (18), the laser light with which the substrate is irradiated is laser light of a continuous-wave laser, or is laser light resulting from time-modulating the continuous-wave laser at pulse width and/or pulse interval on time basis, beam length in a direction perpendicular to the scanning direction being smaller than size of the semiconductor thin film in the direction perpendicular to the scanning direction.

(20), In anyone of (11) to (18), the laser light with which the substrate is irradiated is laser light of a continuous-wave laser, or is laser light resulting from time-modulating the continuous-wave laser at pulse width and/or pulse interval on time basis, the semiconductor thin film irradiated with the laser light being machined in an island-shaped or line-shaped manner, beam length in a direction perpendicular to the scanning direction being larger than or equal to size of the semiconductor thin film machined in the island-shaped or line-shaped manner and measured in the direction perpendicular to the scanning direction.

(21), An image display device including a thin film transistor where the semiconductor thin film of the substantially belt-shaped crystal disclosed in anyone of (1) to (20) is used as a channel.

(22), In (21), there are provided, on the substrate, pixels located in a matrix-like configuration, and a scanning-line driving circuit and a signal-line driving circuit for matrix-driving the pixels, at least the signal-line driving circuit having the thin film transistor where the semiconductor thin film of the substantially belt-shaped crystal is used as the channel.

(23), In (22), there is provided, on the substrate, a circuit other than the pixels and the scanning-line driving circuit and the signal-line driving circuit, the circuit having a thin film transistor where the semiconductor thin film of the substantially belt-shaped crystal is used as a channel.

(24), In anyone of (21) to (23), there are provided an opposed substrate located opposedly to the substrate with a predetermined spacing placed therebetween, and liquid crystal sealed in between the substrate and the opposed substrate.

(25), In anyone of (21) to (23), the substrate has an organic EL layer.

(26), A method of manufacturing a semiconductor thin film which forms a substantially belt-shaped crystal crystallized by scanning laser light or a substrate onto an arbitrary region of the semiconductor thin film and performing a laser irradiation thereon, the substantially belt-shaped crystal being crystallized such that crystalline grains grow in the scanning direction, the semiconductor thin film being formed on the substrate, wherein, as the laser light with which the substrate is irradiated, laser light is used which is time-modulated by a modulator for emitting incident continuous-wave laser after time-modulating the incident continuous-wave laser in correspondence with control voltage, as the modulator, the modulator being used which, if the control voltage is high, emits the incident continuous-wave laser after making intensity of the incident continuous-wave laser equal to zero or changing the intensity to a small value, and which, if the control voltage is low, emits the incident continuous-wave laser with almost no change made to the intensity of the incident continuous-wave laser, the substrate being irradiated with the laser light which is time-modulated by the modulator so that pulse width of control voltage to the modulator on time basis will become longer than pulse interval thereon.

Moreover, the image display device according to the present invention includes an active-matrix substrate having high-characteristics semiconductor thin film transistors which operate on an inexpensive insulating substrate such as glass with a high performance and high reliability, and which are excellent in uniformity among devices.

Incidentally, the present invention is not limited to the above-described configuration and the configuration described in the detailed description of the invention which will be explained later. Namely, it is needless to say that various modifications are possible without departing from the technical idea and spirit of the invention disclosed in the claims of the present application.

It becomes possible to acquire a high-quality and homogeneous-property semiconductor thin film whose grain boundary and grain diameter are controllable and whose film roughness and crystal defects occurring in the process of crystallization are reduced. Then, this semiconductor thin film is applied to driving circuits formed on the active-matrix substrate of the image display device. This makes it possible to provide the semiconductor thin film transistors and further the image display device which are excellent in the uniformity of operation characteristics among devices.

Other objects, features and advantages of the invention will become apparent from the following description of the embodiments of the invention taken in conjunction with the accompanying drawings.

BRIEF DESCRIPTION OF THE DRAWINGS

FIG. 13A, FIG. 13B, and FIG. 13C are explanatory diagrams for explaining arrangement of the high-quality crystallization regions according to the present invention;

FIG. 24A and FIG. 24B are the explanatory diagrams for explaining the crystallization method for crystallizing the amorphous-silicon film by scanning the most common excimer pulse laser-light irradiation; and FIG. 25 is a plan view for illustrating an embodiment of the thin film transistor according to the present invention.

DESCRIPTION OF THE EMBODIMENTS

Figure 1:
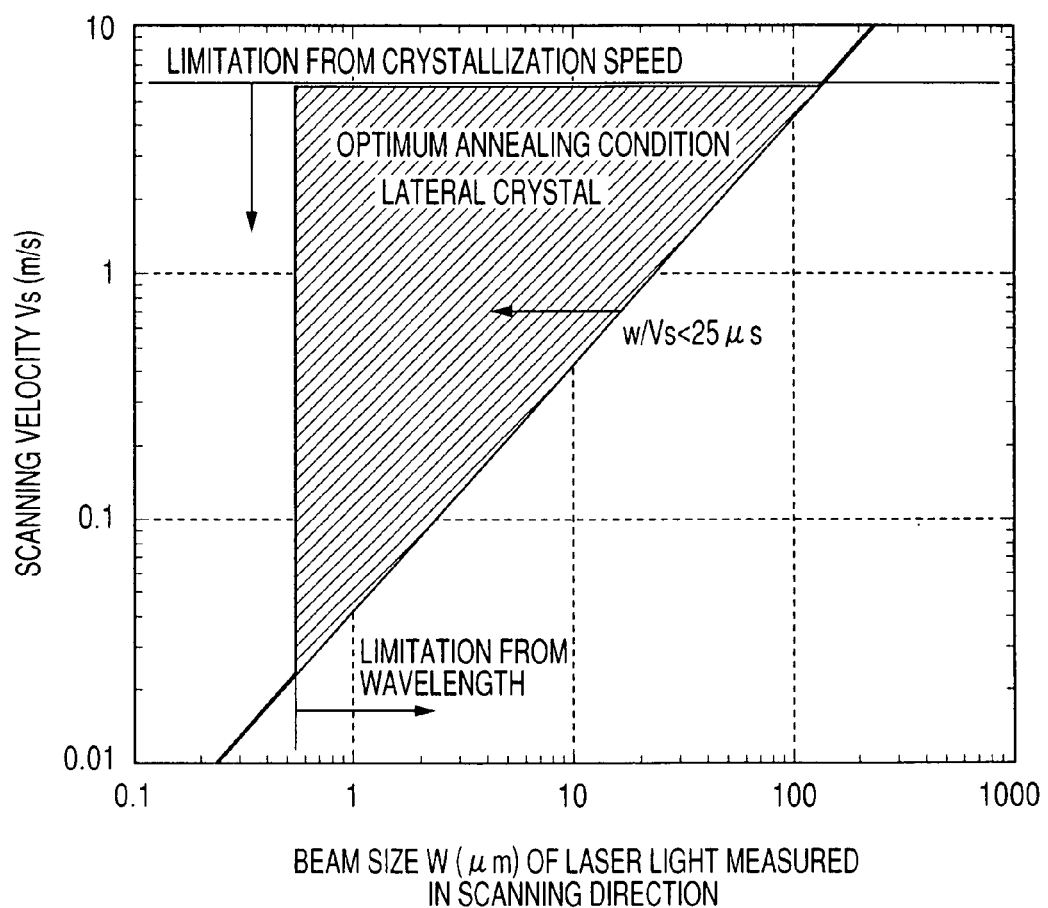
FIG. 1 is an explanatory diagram for explaining conditions and principle based on which the lateral crystal according to the present invention can be acquired with a high yield.

Hereinafter, referring to the drawings of embodiments, the detailed explanation will be given below concerning the embodiments of the present invention. Incidentally, here, although it is assumed that silicon (Si) is mainly used as the semiconductor thin film, the use of thin-film materials such as Ge, SiGe, compound semiconductor, and chalcogenide brings about basically the same effects. In the embodiments described later, the explanation will be given by employing silicon which is commonly used. Also, the present invention is not limited to property modification of a non-crystalline semiconductor film or polycrystal semiconductor film formed on an insulating substrate such as glass for image display devices. Namely, the present invention is also applicable similarly to property modification or the like of a similar semiconductor film formed on the other substrates, e.g., a plastic substrate and a silicon wafer.

Moreover, here, it is assumed that second-harmonics solid laser (wavelength $\lambda=532$ nm) of continuous-wave (CW) and LD (laser diode)-excitation Nd:YVO$_4$ laser is used as laser beam to be used. However, laser is desirable which has wavelength in a region of 200 nm to 700 nm, i.e., wavelength exhibiting absorption capability for an amorphous-silicon or polysilicon semiconductor thin film. More concretely, although second harmonics, third harmonics, fourth harmonics, and the like of Nd:YAG laser, Nd:YVO$_4$ laser, and Nd:YLF laser are applicable, second harmonics (wavelength $\lambda=532$ nm) of LD-excitation Nd:YAG laser or the second harmonics of Nd:YVO$_4$ laser is the most desirable, considering magnitude and stability of the output. Also, the use of such lasers as excimer laser, Ar laser, semiconductor laser, and solid-pulse laser results in basically the same effects.

Figure 8:
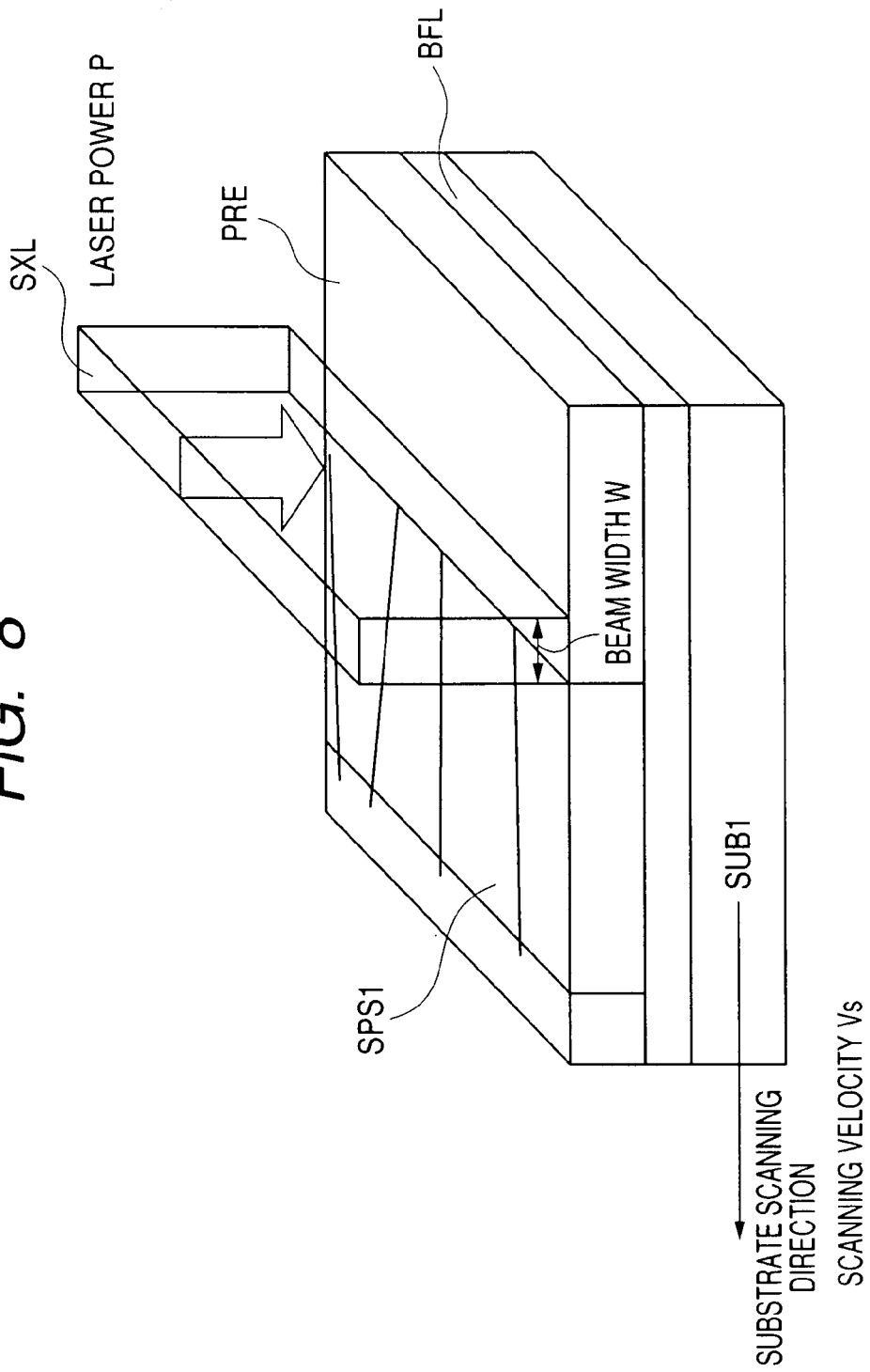
FIG. 8 is a schematic diagram for explaining scanning of laser light SXL in crystallization.
Figure 9:
FIG. 9 is a diagram for illustrating comparison among crystal modes.

First, the explanation will be given below regarding how the invention of an embodiment disclosed hereinafter has been completed. FIG. 8 is a schematic diagram for explaining scanning of laser light SXL in crystallization. FIG. 9 is a diagram for illustrating comparison among crystal modes. A precursor film PRE, which is formed with polysilicon or amorphous silicon on a glass substrate SUB1 via a ground buffer film BFL and whose thickness is smaller than 200 nm, is irradiated with laser light SXL while scanning the substrate or laser light. FIG. 8 illustrates a manner where the substrate is scanned at a scanning velocity Vs. Also, beam size of the laser light measured in substantially the same direction as the scanning direction is equal to W (μm) (hereinafter, described as "beam width W"). The laser irradiation like this anneals the silicon thin film, thereby causing silicon crystalline grains to grow in substantially the same direction as the scanning direction. This allows formation of a substantially belt-shaped crystal silicon film SPSI.

Hereinafter, crystal of the substantially belt-shaped crystal silicon film SPSI will be referred to as "lateral crystal". As illustrated at the upper stage in FIG. 9, the lateral crystal is a flow-like crystal whose average grain-size growth is about 5 to 50 μm (about 5 μm in the drawing) in the laser-irradiation scanning direction (length of the grain) of the laser light SXL, and is about 0.2 to 2 μm (about 0.5 μm in the drawing) in the perpendicular direction (width of the grain) to the scanning direction. In the lateral crystal, the grains exist in a manner of extending in the scanning direction, and its surface is flat and has no projection-and-depression structure. However, since film thickness in the grain-boundary region is thinner than thickness of the grains, the lateral crystal becomes a semiconductor thin film which has a depression structure in the grain boundary. The grain size in the scanning direction is variable, depending on conditions such as power of the laser light SXL, laser fluence, the scanning velocity, the beam width W, thickness of the precursor film, and crystallization state of the precursor.

Furthermore, as the above-described substantially belt-shaped crystal silicon film SPSI, it is particularly desirable to have characteristics described below.

(a) Main orientation with respect to the surface is {110}.

(b) Main orientation of a plane substantially vertical to movement direction of carriers is {100}.

The above-described two azimuths can be estimated using electron-beam diffraction method or EBSP (Electron Backscatter Diffraction Pattern) method.

(c) Defect density of the film is smaller than $1\times10^{17}$ cm$^{-3}$. Crystal-defect number within the film is a value defined from electrical characteristics, or from quantitative estimation of unpaired electrons by electron spin resonance (ESR).

(d) Hall mobility of the film ranges from 50 cm$^2$/V s or more to 700 cm$^2$/V·s or less.

(e) Thermal conductivity of the film has temperature dependence, and exhibits maximum value at a certain temperature. If temperature rises, the thermal conductivity rises at one time, then exhibiting maximum value which ranges from 50 W/mK or more to 100 W/mK or less. In high-temperature region, the thermal conductivity decreases in accompaniment with the temperature rise. The thermal conductivity is a value estimated and defined from three-omega method or the like.

(f) Raman shift estimated and defined from Raman scattering spectroscopy of the thin film ranges from 512 $cm^{-1}$ or more to 515 $cm^{-1}$ or less.

(g) Distribution of Σ value of the film's crystalline grain-boundary has maximum value at Σ11, and exhibits Gaussian distribution. Incidentally, Σ value is a value measured from electron-beam diffraction method or EBSP (Electron Backscatter Diffraction Pattern) method.

(h) Optical constant of the film is characterized by being a region satisfying the following conditions: Namely, refractive index n at wavelength 500 nm ranges from 2.0 or more to 4.0 or less, and attenuation coefficient k ranges from 0.3 or more to 1 or less. In addition, refractive index n at wavelength 300 nm ranges from 3.0 or more to 4.0 or less, and attenuation coefficient k ranges from 3.5 or more to 4 or less. Incidentally, the optical constant is a value measured by spectroscopic ellipsometer.

The thin film transistor to which the substantially belt-shaped crystal silicon film SPSI, i.e., the lateral crystal like this, is applied has characteristics of high performance, high reliability, and further, low variation.

Depending on the process conditions of crystallization, a granular crystal is acquired as is illustrated at the intermediate stage in FIG. 9. This is because random core generation occurs if laser fluence is low, or if solidification time is not long enough to allow the lateral growth. Similarly to the crystal acquired by the conventional ELA, the granular crystal is a crystal whose size is smaller than about 1 μm, and which has grown from a crystal core formed at random within the silicon film. As a consequence, the crystal-growth direction is not uniform. Furthermore, since the grains collide with each other at the time of the crystal growth, a 10 nm or more projection-and-depression structure exists on the film surface. In particular, in the grain boundary, there occurs a protrusion whose height is higher than 10 nm.

Meanwhile, as illustrated at the lower stage in FIG. 9, if the laser fluence is given to the semiconductor thin film in excess, aggregation occurs in liquid silicon state at the time of laser annealing. The aggregation is a state where a part of the film has flaked off, and where, as illustrated in the table, a semi-cylindrical striped crystal is formed. Depending on presence or absence of the crystal, a projection-and-depression structure exists on the film surface. Factors associated with and exerting influences on the lateral crystal, the granular crystal, and the aggregation state described above are as follows: Heat absorption and thermal conductance by the laser beam irradiation, the solidification process from liquid phase to solid phase, release of latent heat in the process and thermal conductance to the substrate, and the like.

FIG. 1 is an explanatory diagram for explaining conditions and principle based on which the lateral crystal according to the present invention can be acquired with a high yield. Namely, FIG. 1 illustrates necessary conditions when crystalline grains lateral-grow in substantially parallel to a scanning direction by irradiating with laser light an arbitrary region of the semiconductor thin film formed on a substrate. This irradiation is performed by scanning the substrate at a scanning velocity Vs (m/s) in the same direction as a beam-width direction. Here, the laser light is laser light whose wavelength is equal to 532 nm and whose beam size (i.e., beam width) measured in substantially the same direction as the scanning direction is equal to W. In FIG. 1, on XY coordinates where value x of the beam width W (μm) of the laser light is defined as X axis, and where value y of the scanning velocity Vs (m/s) is defined as Y axis, the crystallization processing is executed within a region where all of the following conditions hold:

(condition 1) the beam width W is larger than the wavelength of the laser beam, (condition 2) the scanning velocity Vs (m/s) is smaller than upper-limit of crystal growth speed, and (condition 3) x×(1/y)<25 μs. The execution of the crystallization processing allows acquisition of the lateral crystal on the large-area substrate, with an excellent uniformity and reproducibility, and with the high yield. Here, the beam width W is defined as a size having light intensity which is larger than 13.5% of maximum beam light-intensity on the semiconductor thin film irradiated with a beam spot. It is desirable that beam profile, i.e., intensity distribution in the beam-width direction, be a distribution of Gaussian type, trapezoidal type, or top-flat type. These necessary conditions also hold even if thickness of the silicon semiconductor thin film is smaller than 500 nm, or even if the substrate is formed of a substance other than glass, e.g., quartz, single-crystal silicon, plastic, ceramics, and the like.

The condition 1 is determined from the fact that a limit to which the beam size can be focused is its wavelength.

Figure 2A:
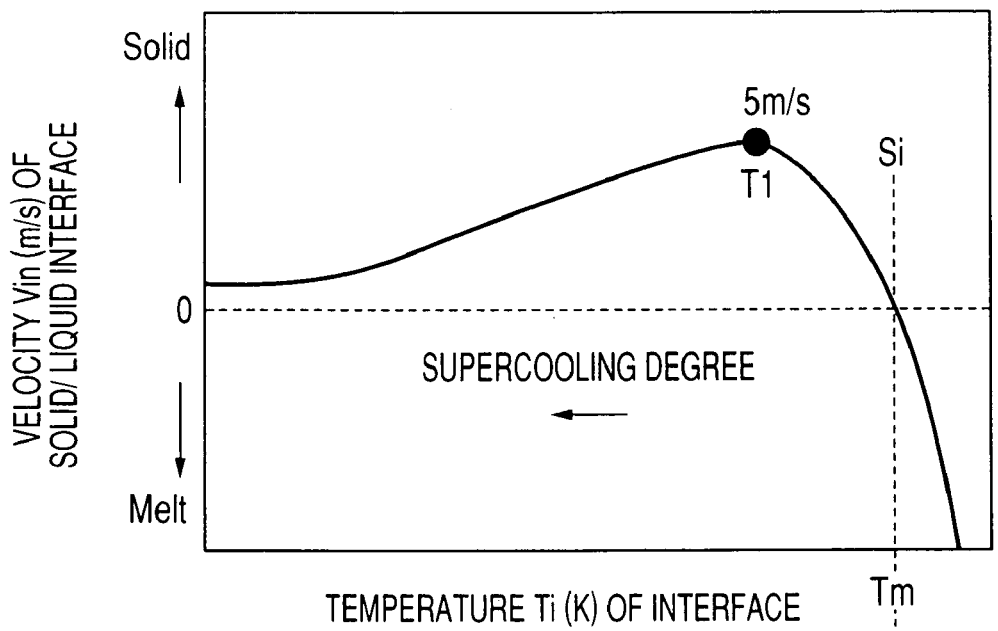
FIG. 2A and FIG. 2B are explanatory diagrams for explaining velocity at which interface of solid silicon and liquid silicon moves and crystal-core generation ratio.
Figure 2B:
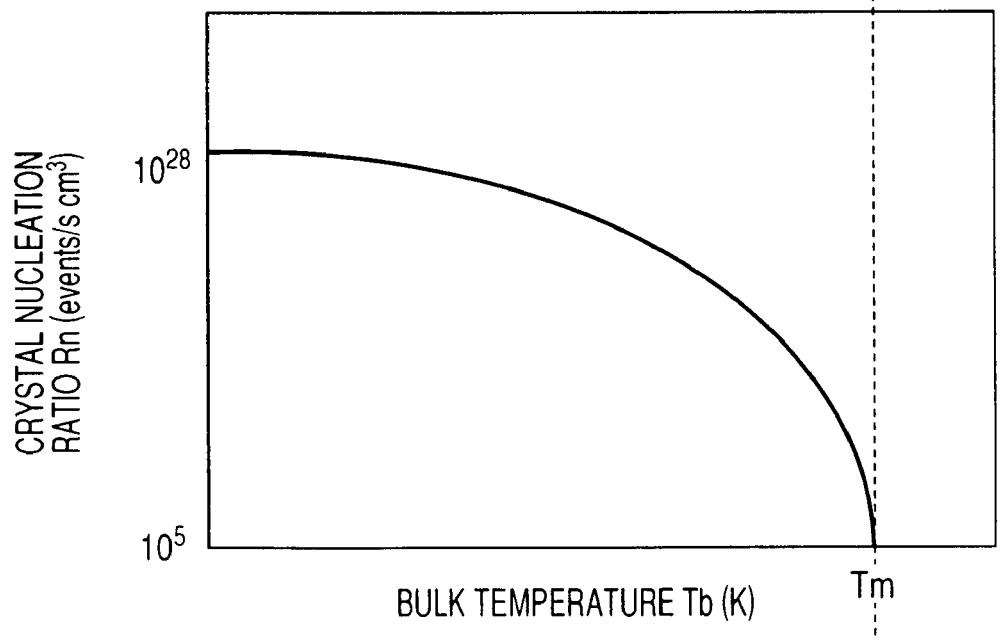

The condition 2, which indicates a speed at which liquid silicon melted by the laser annealing is crystallized, is determined by a physical state illustrated in FIG. 2A and FIG. 2B.

FIG. 2A and FIG. 2B are explanatory diagrams for explaining velocity at which interface of solid silicon and liquid silicon moves and crystal-nucleation ratio. FIG. 2A illustrates the velocity Vin (m/s) at which the solid/liquid interface moves by interface temperature Ti (K) of the solid/liquid silicon. If the velocity Vin at which the solid/liquid interface moves is positive, solidification, i.e., crystallization, develops. Meanwhile, if the velocity Vin is negative, melting develops. To which of the solidification and the melting the state will develop depends on the interface temperature Ti. When the interface temperature is lower than the melting point Tm of silicon, the state is a supercooled state. In the supercooled state like this, the solidification develops. In the case of silicon, maximum value of the solidification velocity is equal to about 5 m/s at a point of temperature T1.

FIG. 2B illustrates the crystal-nucleation ratio Rn (events/s $cm^3$) with respect to bulk temperature Tb (K) of the melted Si. The larger the supercooling degree becomes (i.e., the lower the bulk temperature Tb becomes), the more the crystal-nucleation ratio increases. From the above-described explanation, the condition 2 is determined by maximum crystallization speed of the semiconductor thin film. Accordingly, in the case of the thin film silicon, the upper-limit of the crystal growth speed becomes equal to 5 m/s.

The condition 3 is a condition for avoiding the drawbacks due to excessive temperature rise in the silicon semiconductor thin film, such as the flake-off or aggregation of the film, and the damage and stress to the substrate and ground buffer layer. It is desirable that optimum irradiation laser-fluence to the silicon precursor film ranges from 0.5 $J/cm^2$ or more to 5.0 $J/cm^2$ or less. Prolonging beam duration time ts (μs), or increasing power density P ($W/cm^2$) makes it possible to ensure the laser fluence necessary for the crystallization. The suitable laser-irradiation conditions, however, change in a manner of being dependent on the power density P rather than the beam duration time ts. Increasing the power density P results in increases in highest attainment temperature and melting time of the silicon.

Meanwhile, even if the beam duration time ts is prolonged by retarding the scanning velocity Vs, or by enlarging the beam width W, the highest temperature of the silicon does not change in proportion thereto, but only the melting time is prolonged. Two physical factors are concerned with this phenomenon. A first factor is as follows: If the beam duration time ts is long, it turns out that excessive energy is given to the silicon even if the silicon has been melted. Then, the excessive heat dissipates away to the substrate via the ground layer. This, as a consequence, brings about a loss of the energy. Moreover, the melting time prolonged causes state of the silicon to come nearer to a stationary state. This gives rise to the following problems: Namely, occurrence ratio of the silicon's aggregation is raised, there occur the damage and stress to the substrate and ground buffer layer, and degradation in characteristics of the thin film transistors takes place because amount of involved impurities increases.

A second factor is as follows: When the surface of Si starts to be melted, reflectivity of the liquid silicon with respect to the laser light increases by 30% of the solid-phase silicon. Accordingly, even if the beam duration time ts has been prolonged, no absorption amount of the laser light increases. This, as a consequence, brings about a loss of the energy.

Furthermore, a limit of the beam duration time ts (i.e., $x \times (1/y)$ in FIG. 1) for preventing these problems from occurring is equal to 25 μs or less. From the above-described reasons, the following has been found out: Namely, the irradiation with the laser in a short time allows suppression of the silicon's aggregation, avoidance of damage to the ground by heat, and acquisition of the stable lateral crystal.

Figure 7:
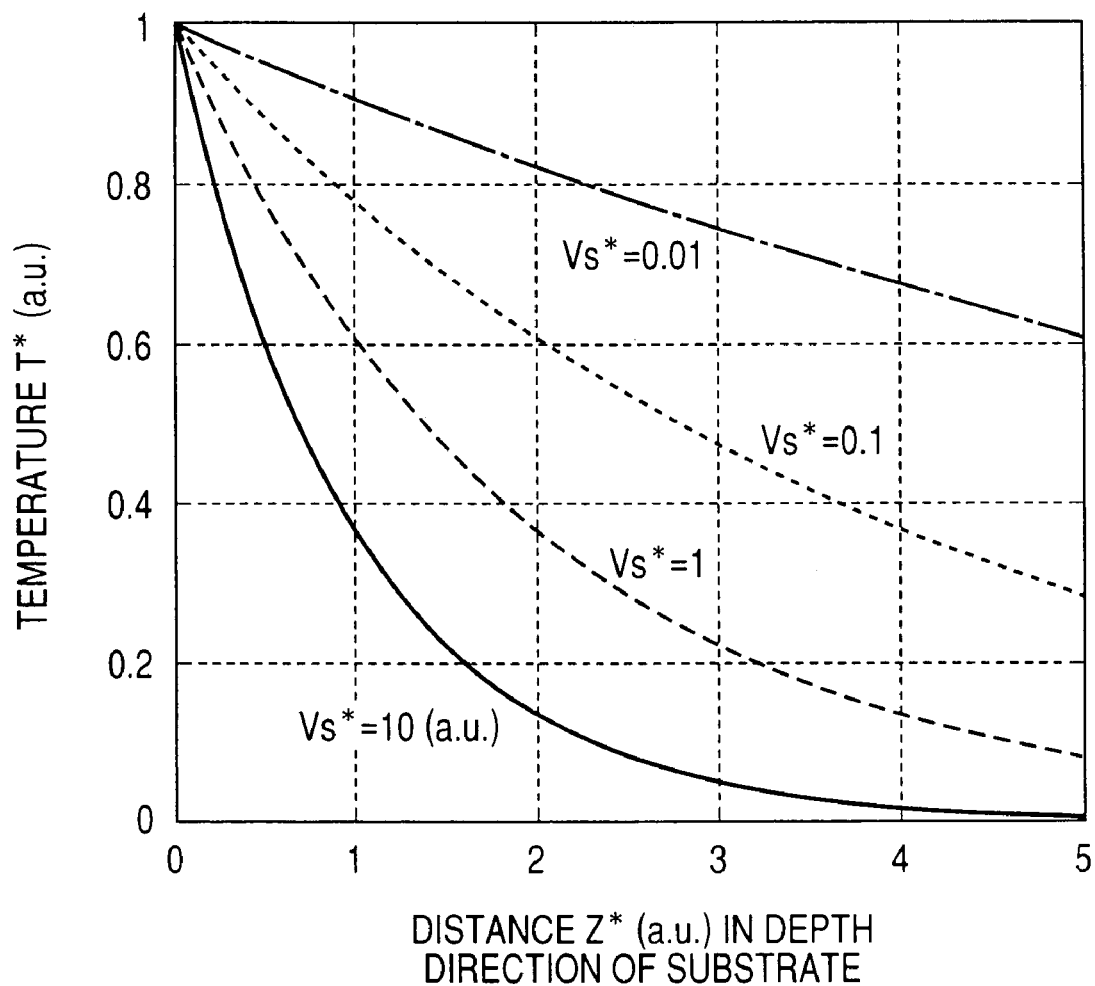
FIG. 7 is an explanatory diagram for explaining scanning-velocity dependence of heat diffusion in depth direction of the substrate.

FIG. 7 is an explanatory diagram for explaining scanning-velocity dependence of heat diffusion in depth direction of the substrate. Transverse axis is a value $Z^*$ (a. u.) resulting from normalizing distance in the depth direction of the substrate, and longitudinal axis is a value $T^*$ (a. u.) resulting from normalizing temperature with the substrate surface ($Z^*=0$) selected as the criterion. Numerical values indicated in the transverse axis and longitudinal axis are relative values, since the numerical values are represented by the normalized ones. Four types of values $V_s^*$ (a. u.), i.e., 0.01, 0.1, 1, and 10, which result from normalizing the scanning velocity Vs, are indicated by the graphs, respectively. This drawing indicates that, the larger $V_s^*$ becomes, the more difficult it becomes for the heat to dissipate away to the substrate. Consequently, speeding up the scanning velocity Vs, i.e., decreasing the beam duration time ts, makes it possible to decrease heat diffusion distance and temperature of the substrate with the highest attainment temperature of the film kept constant. From this result as well, it can be said that the decrease in the beam duration time ts is effective in avoiding the heat damage to the substrate and ground buffer layer, and in suppressing the silicon's aggregation.

Figure 3:
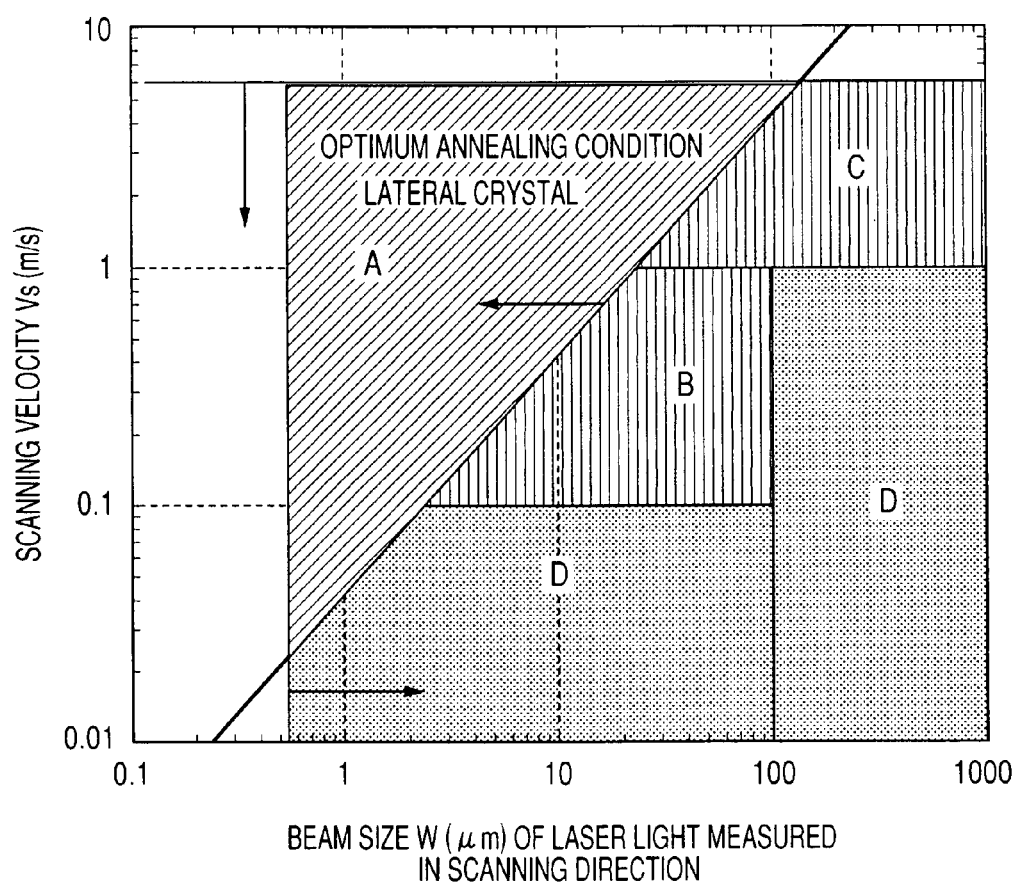
FIG. 3 is a diagram where the region on the XY coordinates explained in FIG. 1 is divided into regions A, B, C, and D.

FIG. 3 is a diagram where the region on the XY coordinates explained in FIG. 1 is divided into regions A, B, C, and D. FIG. 4A, FIG. 4B, FIG. 4C, and FIG. 4D are diagrams for illustrating characteristics of n-channel thin film transistors corresponding to the regions A, B, C, and D illustrated in FIG. 3. FIG. 4A, FIG. 4B, FIG. 4C, and FIG. 4D correspond to the regions A, B, C, and D, respectively. Incidentally, the plural transistor characteristics are measured and indicated by the graphs, setting transverse axis as gate voltage $V_G$ (V) and setting longitudinal axis as drain current $I_D$ (A) and electric-field effect mobility μef (cm$^2$/Vs), and on condition that drain voltage $V_D$ (V)=0.1 (V), gate width=4 μm, and gate length=4 μm.

Figure 4A:
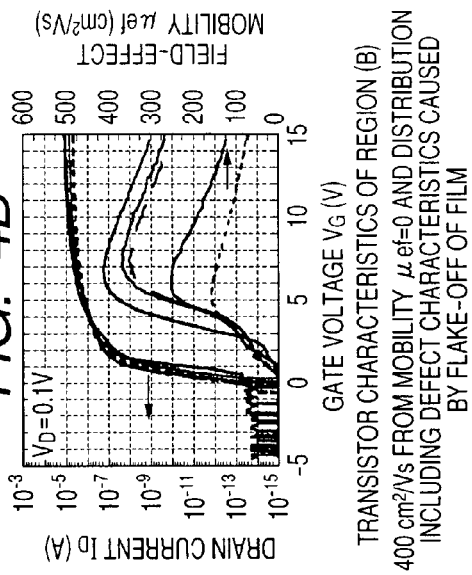
FIG. 4A, FIG. 4B, FIG. 4C, and FIG. 4D are diagrams for illustrating characteristics of n-channel thin film transistors corresponding to the regions A, B, C, and D illustrated in FIG. 3.
Figure 4B:
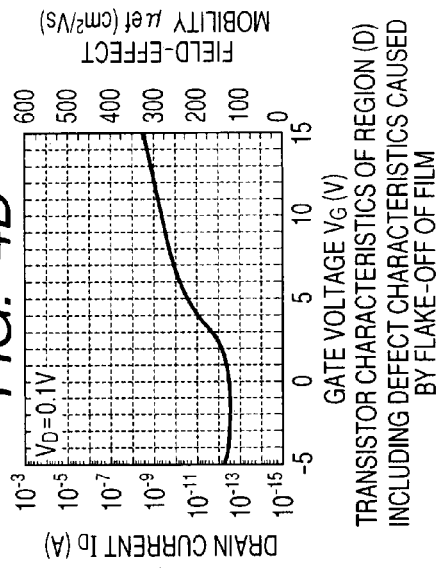
Figure 4C:
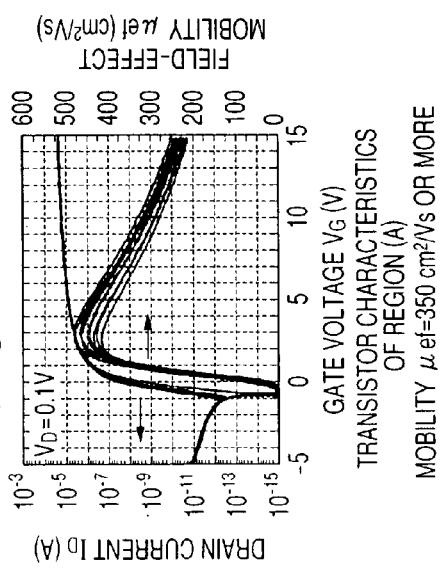
Figure 4D:
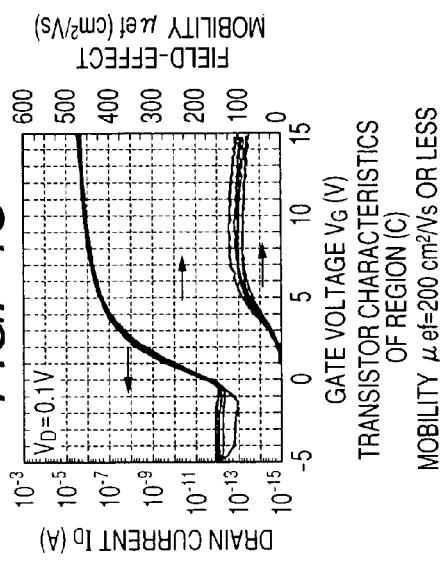

The region A in FIG. 3 is a condition that allows acquisition of the optimum lateral crystal. Namely, as illustrated in FIG. 4A, characteristics are acquired that the electric-field effect mobility μef is of high performance, i.e., 350 cm$^2$/Vs or more, and that uniformity among the transistors are excellent. In the region B in FIG. 3, since a region where temperature rises in excess is included, flake-off and aggregation of the silicon thin film occur in a part thereof. This, as illustrated in FIG. 4B, results in inclusion of contact-defective transistor and mobility-decreased transistor. Consequently, since there exists a problem that variations are large and the performances are degraded partially, the transistors are inapplicable to a circuit caused to operate at a high speed. In the region C in FIG. 3, the lateral crystal has not grown. largely enough. As a result, as illustrated in FIG. 4C, characteristics are acquired that the electric-field effect mobility μef is equal to 200 cm$^2$/Vs or less. This makes the transistors inapplicable to a circuit caused to operate at a high speed. In the region D in FIG. 3, the flake-off and aggregation of the silicon thin film occur in a proportion of 50% or more. This, as illustrated in FIG. 4D, makes it impossible to acquire an excellent transistor.

As explained so far, the crystallization processing is executed within the region where all of the following conditions hold:

(condition 1) the beam width W is larger than the wavelength of the laser beam, (condition 2) the scanning velocity Vs (m/s) is smaller than upper-limit of the crystal growth speed, and (condition 3) $x \times (1/y) < 25$ μs. The execution of the crystallization processing allows acquisition of the lateral crystal on the large-area substrate, with the excellent uniformity and reproducibility, and with the high yield.

Hereinafter, more desirable conditions will be exemplified.

Concerning the condition 3, setting $x \times (1/y) < 12.5$ μs allows acquisition of more stable crystal. Furthermore, setting $x \times (1/y) < 10$ μs allows attainment of high-yield implementation.

In the case of using silicon as the semiconductor thin film, although it is desirable that silicon film thickness be 200 nm or less, and it is further desirable that the film thickness be 40 to 200 nm, the film thickness is not limited thereto.

Also, in the case of using silicon as the semiconductor thin film, although irradiation with 532-nm-wavelength laser is desirable, the laser wavelength is not limited thereto.

As described already, it is preferable that the beam duration time ts be shorter. For implementing this, two types of methods can be considered, i.e., a method of making the beam width W smaller, and a method of making the scanning velocity Vs larger.

Regarding the scanning velocity Vs, 0.3 m/s or more is desirable, and 0.5 m/s or more is more desirable. Too large scanning velocity, however, causes vibration to occur, or makes it difficult to control the device. Accordingly, as the realistic upper-limit, 1 m/s or less is desirable.

As the beam width W, 2 to 10 μm is desirable. More desirable condition is 2 to 6 μm. Also, 2 to 4 μm is even more desirable.

Incidentally, as having been already explained, making the beam width W smaller and making the scanning velocity Vs larger makes the energy loss smaller. This allows employment of smaller-output laser. Taking another point-of-view, even if one and the same-output laser is employed, making the beam width W smaller and making the scanning velocity Vs larger makes the smaller-output laser sufficient for the necessary laser output. Consequently, it becomes possible to allocate the remaining power to a length direction (i.e., direction perpendicular to the scanning direction) of the laser beam, and thereby to enlarge a range capable of being irradiated with the laser light at a time. This results in an effect of being capable of enhancing the throughput.

It is desirable that the laser light with which the substrate is irradiated be laser light of a continuous-wave laser, or be laser light resulting from time-modulating the continuous-wave laser at pulse width and/or pulse interval on time basis. Incidentally, from the viewpoint of maintenance, solid laser is more desirable than gas laser.

The above-described conditions are the more desirable ones. The more desirable conditions, however, are not limited to these conditions, because these conditions have been provided merely as the exemplification.

Figure 5:
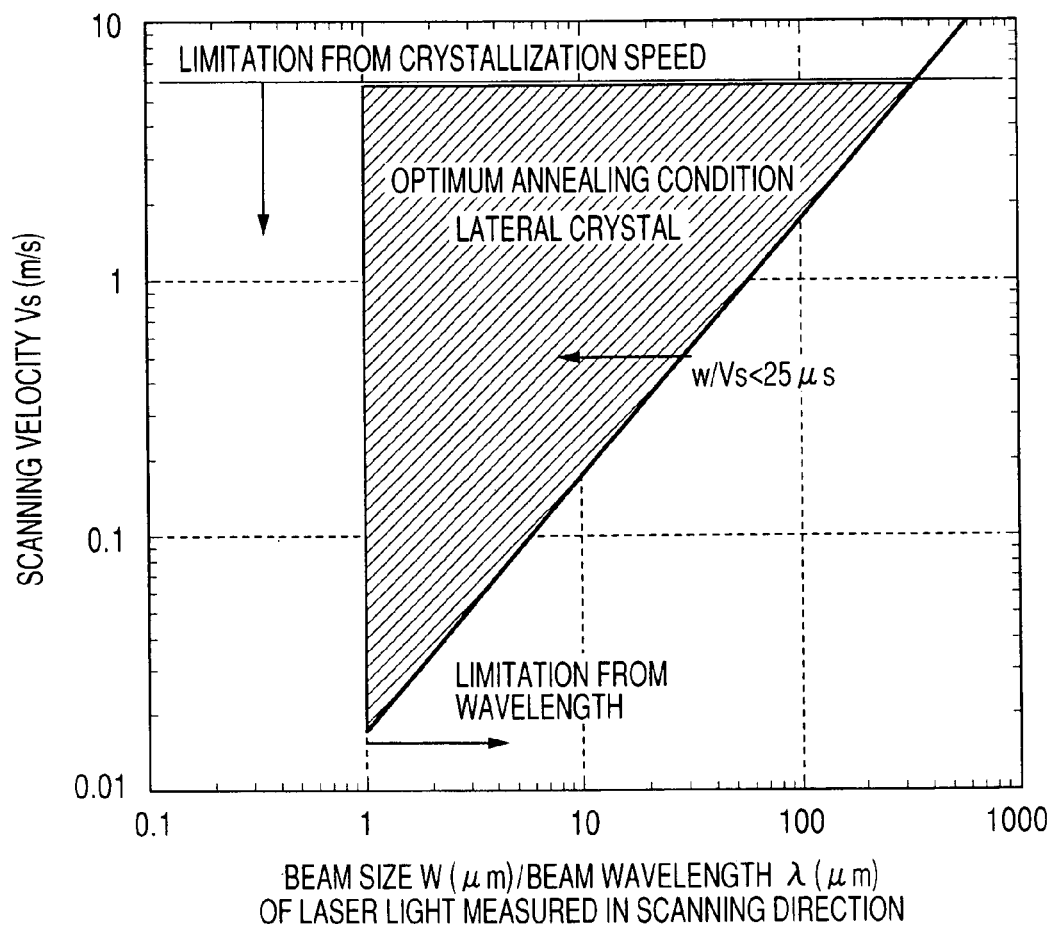
FIG. 5 is a diagram for illustrating conditions based on which the lateral crystal can be acquired.

FIG. 5 is a diagram for illustrating conditions based on which the lateral crystal can be acquired. FIG. 5 illustrates the process conditions in the case where value normalized by wavelength is caused to correspond to X axis so that the conditions are applicable to an arbitrary laser beam whose wavelength is 700 nm or less. Accordingly, the transverse axis X becomes value x of beam size W (μm)/beam wavelength λ (μm) of the laser light measured in the scanning direction. Consequently, the condition 1 is rewritten as x>1. For example, the conditions are applicable to the crystallization by excimer laser in UV region, or to the third-harmonics and fourth-harmonics wavelengths of solid laser.

Figure 6:
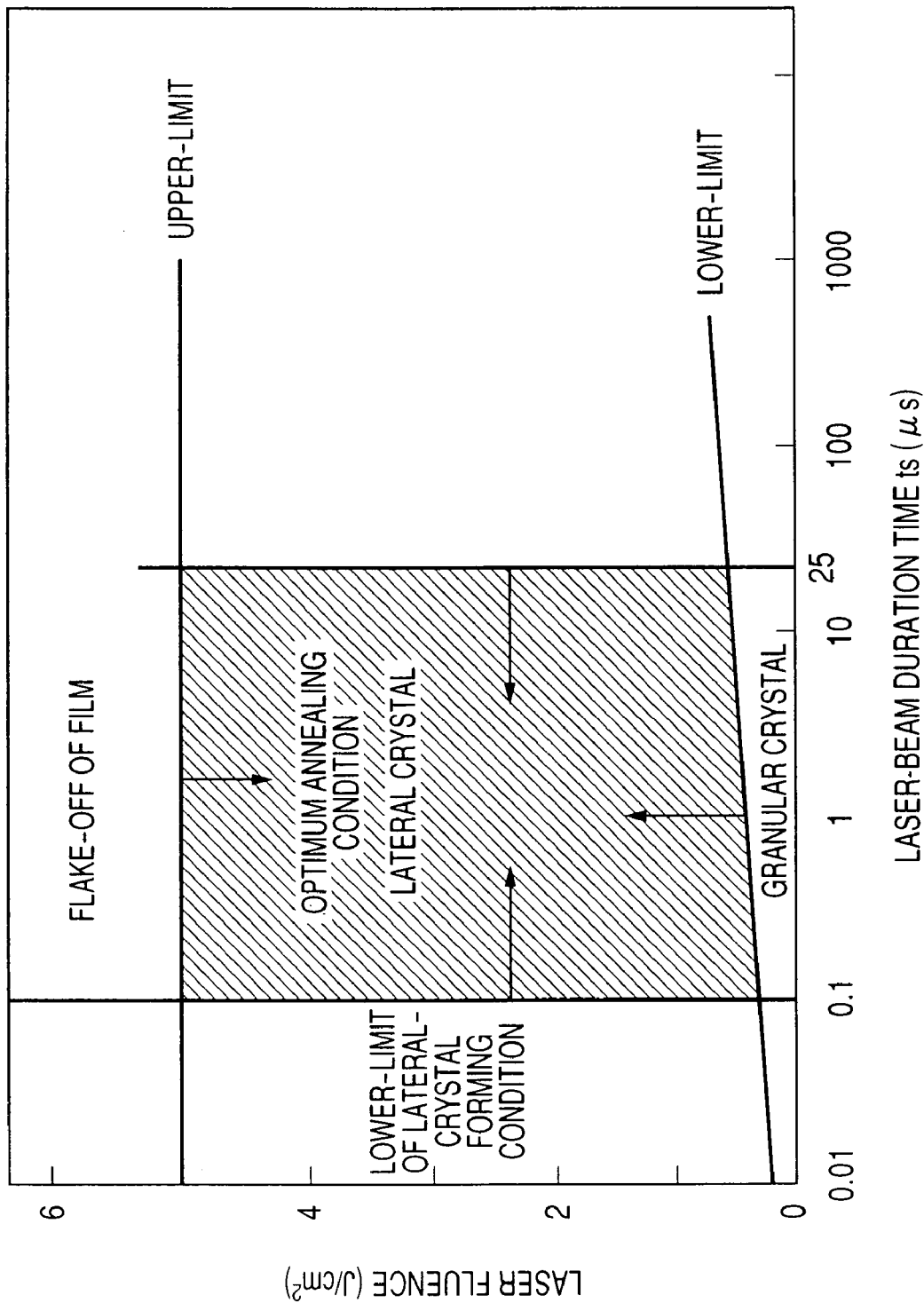
FIG. 6 is a diagram for illustrating conditions based on which the lateral crystal can be acquired with a high yield.

FIG. 6 is a diagram for illustrating conditions based on which the lateral crystal can be acquired with a high yield. FIG. 6 illustrates optimum annealing conditions based on which the lateral crystal can be acquired on XY coordinates where value x of duration time ts (μs) of the laser beam onto the semiconductor thin film is defined as X axis, and where value y of laser fluence (J/cm$^2$) is defined as Y axis.

Boundary conditions on which substantially belt-shaped crystal where lateral-crystal growth has been induced is formed are $y>0.04x+0.1$ (expression 1), and $x>0.1$ (expression 2)

Also, boundary conditions on which flake-off of the semiconductor thin film occurs are $y<5$ (expression 3), and $x<25$ (expression 4).

It is preferable that the crystallization be executed within a region surrounded by these (expression 1), (expression 2), (expression 3), and (expression 4). The reason why inclination of the straight line of (expression 1) is the positive value is as follows: As described earlier, if the beam duration time ts has been prolonged, the thermal conduction to the substrate increases. This prevents the irradiation laser fluence from being consumed for temperature rise in the silicon with a high efficiency. As described earlier, if the beam duration time ts has been prolonged, temperatures of the substrate and ground buffer layer rise, or temperature of the melted silicon rises in excess, or further, the melting time is prolonged. This brings about the increase in the flake-off or aggregation of the film, or in the damage and stress to the substrate.

Figure 10:
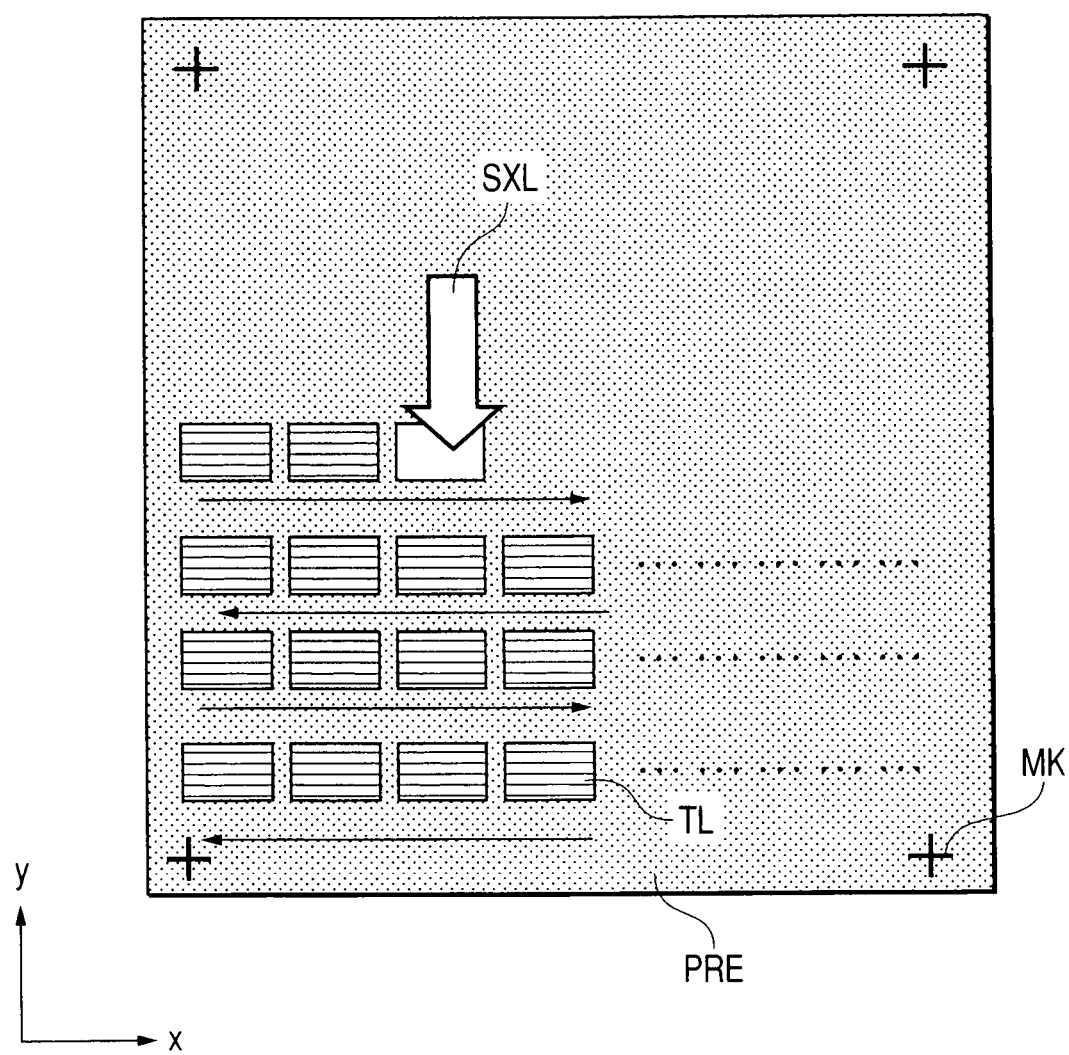
FIG. 10 is an explanatory diagram for explaining crystallization method according to the present invention.
Figure 11:
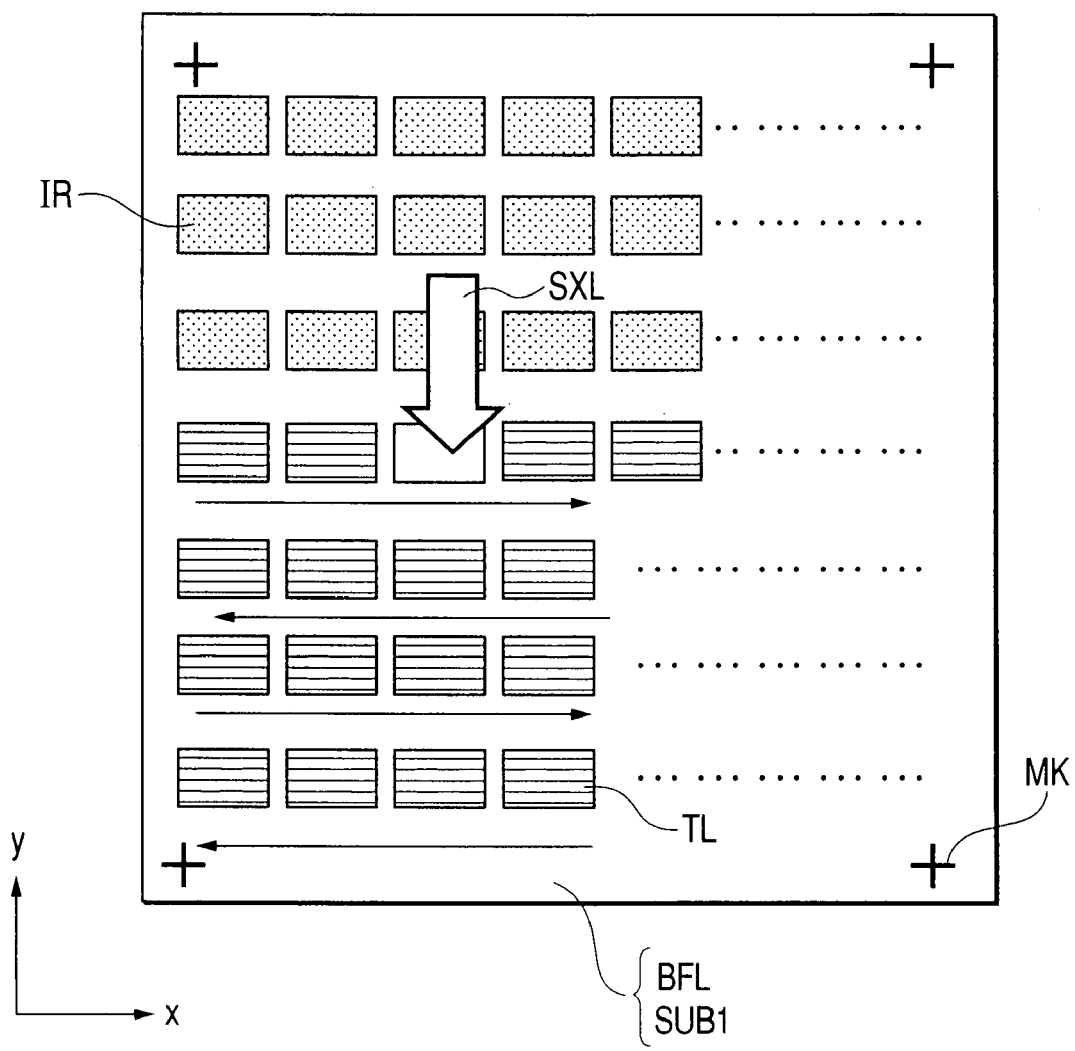
FIG. 11 is an explanatory diagram for explaining crystallization method according to the present invention.

FIG. 10 and FIG. 11 are explanatory diagrams for explaining crystallization methods according to the present invention. FIG. 10 illustrates a method where the crystallization process conditions explained so far are applied thereby to form lateral crystal in an arbitrary region, in a tile-like manner, and with a predetermined spacing. A precursor PPE, which is composed of amorphous or polysilicon on a buffer layer BFL formed on an insulating substrate SUB1, is irradiated with laser light SXL in accordance with the process conditions satisfying the ranges illustrated in FIG. 1, FIG. 3, FIG. 5, and FIG. 6. This forms a property-modified region TL of silicon film composed of the lateral crystal (i.e., crystal which has grown in a substantially belt-shaped manner. In the present embodiment, a plurality of property-modified regions TL are formed uncontinuously in a state of being maintained at a spacious distance to each other. Namely, the regions TL are formed in the tile-like manner, and accordingly these property-modified regions TL are described as "tiles TL" in some cases.

The continuous-wave laser light has been time-modulated at a predetermined pulse width and/or pulse interval by a modulator (e.g., EO (Electro-Optic Device) modulator utilizing electro-optic effects, AO (Acoustic-Optic Device) modulator utilizing acoustic-optic effects, or the like). The laser or the substrate is scanned, thereby making it possible to matrix-locate the single or plural arbitrarily-sized property-modified regions TL with an arbitrary spacing. The laser light SXL is laser light resulting from time-modulating the continuous-wave laser light into a 100-ns to 100-ms pulse width and a 10-μs-or-less pulse interval. This time modulation makes it possible to accomplish the objects of the present invention. As illustrated in the drawing, the pulse width and pulse interval are controlled. Then, while performing irradiation with the laser light SXL having 5-μm laser-beam width W, the substrate is scanned at a velocity of 0.5 m/s in X direction, and is then scanned in –X direction after being shifted in Y direction. This allows acquisition of the tiles TL of the property-modified regions having the lateral crystal in the scanning directions X and –X.

Also, the insulating substrate SUB1 is provided with marks MK for positioning, and the scanning with the laser light SXL is performed with the marks MK used as positioning targets. In this way, the substrate is scanned while performing the laser irradiation intermittently, which makes it possible to arrange the plural property-modified regions TL. Incidentally, if a single property-modified region TL is to be formed, the time modulation of the laser light is not necessarily required.

Incidentally, in the present embodiment, beam length in a direction perpendicular to the scanning directions is smaller than size of the semiconductor thin film in the direction perpendicular to the scanning directions. This permits the heat to dissipate away to the outside at an end portion in the beam-length direction, thereby resulting in an effect that the aggregation becomes unlikely to occur.

FIG. 11 is a diagram for illustrating a second crystallization method in accordance with the crystallization conditions illustrated in FIG. 1, FIG. 3, FIG. 5, and FIG. 6. On a buffer layer BFL formed on an insulating substrate SUB1, the precursor PRE (refer to FIG. 8) composed of amorphous or polysilicon is machined in advance in an island-shaped or line-shaped manner in an arbitrary region and in an arbitrary size. Then, while irradiating this machined island-shaped or line-shaped precursor PRE with the laser light SXL having, e.g., 5-μm laser-beam width W, the substrate is scanned at a velocity of 0.5 m/s in X direction, and is then scanned in –X direction after being shifted in Y direction. This allows acquisition of arbitrary island-shaped or line-shaped property-modified regions TL having lateral crystal in the scanning directions X and –X. Additionally, the insulating substrate SUB1 is provided with marks MK for positioning, and the scanning with the laser light SXL is performed with the marks MK used as positioning targets. Incidentally, in the present embodiment, the time modulation of the laser light is not necessarily required.

Additionally, in the present embodiment, the semiconductor thin film to be irradiated with the laser light is machined in the island-shaped or line-shaped manner. Moreover, beam length in a direction perpendicular to the scanning directions is larger than or equal to size of the semiconductor thin film machined in the island-shaped or line-shaped manner and measured in the direction perpendicular to the scanning directions. In this case, however, as compared with the case in FIG.

10, the aggregation becomes more likely to occur at an end portion of the semiconductor thin film. This enlarges an inoperative region in no-good crystal state unsuitable for the application to thin film transistors, which must be dealt with caution. Additionally, it is allowable to irradiate two or more machined semiconductor thin films with the laser light at the same time.

In either case of FIG. 10 and FIG. 11, a single thin film transistor may be formed in a single property-modified region TL. Otherwise, plural thin film transistors may be formed in a single property-modified region TL.

Figure 12A:
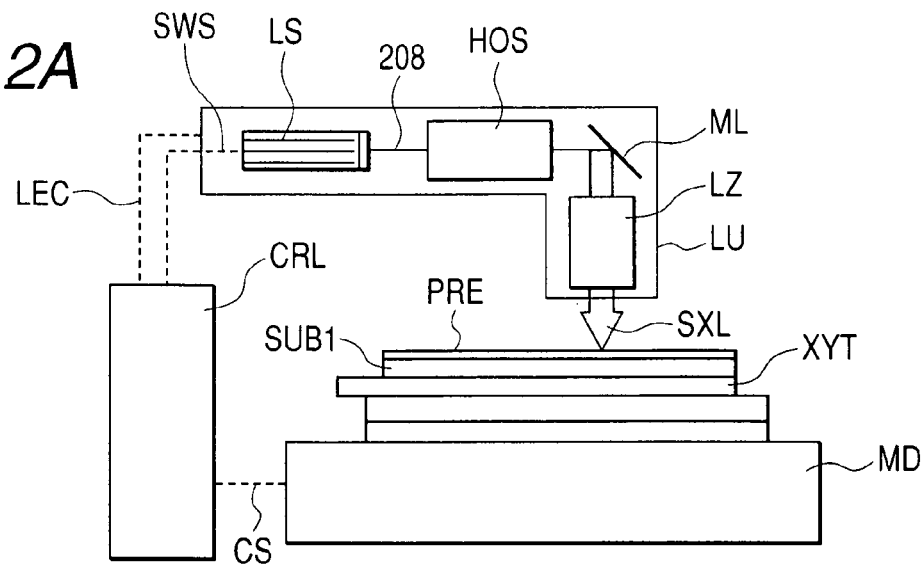
FIG. 12A, FIG. 12B, and FIG. 12C are explanatory diagrams for explaining an example of laser-light irradiation device according to the present invention and location of high-quality crystallization regions.
Figure 12B:
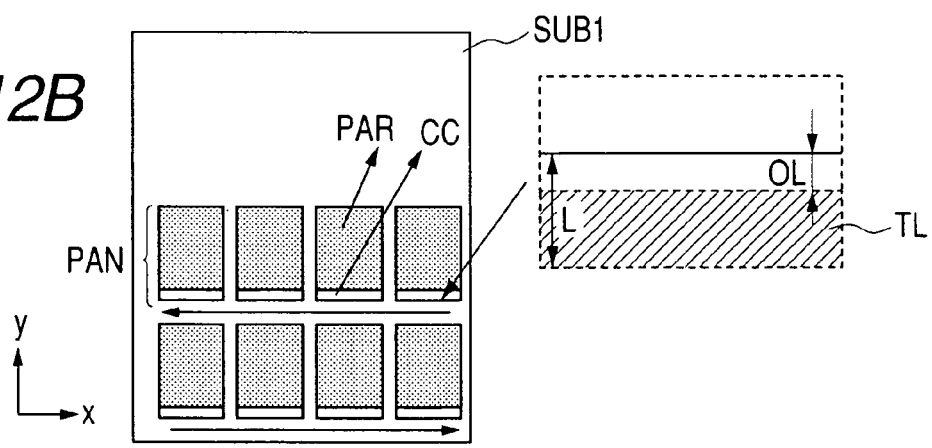
Figure 12C:
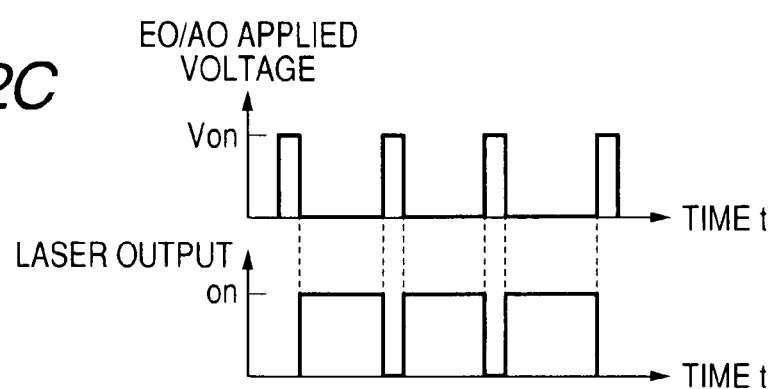

FIG. 12A, FIG. 12B, and FIG. 12C are explanatory diagrams for explaining an example of laser-light irradiation device according to the present invention and location of high-quality crystallization region. Namely, FIG. 12A, FIG. 12B, and FIG. 12C are the diagrams for explaining the laser-light irradiation device and an example of the irradiation method. FIG. 12A is configuration diagram of the laser-light irradiation device, FIG. 12B is plan view for explaining an example of layout of property-modified regions, and FIG. 12C is the diagram for illustrating relationship between laser-light output and applied voltage applied to a modulator (e.g., EO or AO modulator or the like) in terms of time axis.

As illustrated in FIG. 12A, in this irradiation device, a glass substrate SUB1 on which a semiconductor precursor film PRE is formed is set on a stage XYT for driving the glass substrate in X and Y directions. Then, the position alignment is performed using a reference-position measuring camera. A reference-position measuring signal LEC is inputted into a control device CRL, and infinitesimal adjustment of the irradiation position is performed based on a control signal CS inputted into a driving equipment MD. Moreover, the stage XYT is displaced at a predetermined velocity, thereby performing the scanning in one direction. In synchronization with the scanning like this, the precursor PRE of amorphous-silicon or polysilicon film is irradiated with laser light SXL from an irradiation equipment LU. This allows property modification of the precursor into a substantially belt-shaped crystal silicon film SPSI.

Configuration components located in the irradiation equipment LU as an example are as follows: An oscillator LS of semiconductor laser diode (LD)-excitation continuous-wave (CW) solid laser, an optical system HOS for inputting laser output 208 from the oscillator LS, a reflection mirror ML, and a light-converging lens system LZ. This allows formation of an irradiation laser beam having desired beam width W, beam length L, and intensity distribution. Additionally, the optical system HOS includes a beam shaper (homogenizer), and a modulator (e.g., EO or AO modulator or the like) for time-modulating the continuous-wave laser at a predetermined pulse width and/or pulse interval. Decreasing the scanning velocity Vs requires the laser light whose beam width is narrow, e.g., 10 µm or less. This can be implemented mainly by the light-converging lens system LZ. Although the present invention can be carried out without the light-converging lens system LZ, the insertion of the light-converging lens system LZ makes it possible to implement the present invention more easily.

Conditions such as the irradiation time and irradiation intensity of the laser light SXL are controlled by the control device CRL. In correspondence with the length and spacing of a property-modified region TL where lateral crystal is to be formed, the pulse width and pulse interval are changed in a manner of being interrelated with each other. The property-modified regions TL formed in this way are located in the tile-like manner in some cases. Accordingly, as described earlier, the regions TL are described as "tiles TL" in some cases.

FIG. 12B illustrates an example of layout of the substantially belt-shaped crystal semiconductor thin film, i.e., the property-modified regions TL formed of the lateral crystal. In the present embodiment, the explanation will be given below selecting as an example the case where plural panels PAN will be manufactured from a single substrate. Within a property-modified region TL, plural thin film transistors and circuits will be formed. In the present embodiment, length of the property-modified region TL corresponds to length of one side of a single panel PAN of the image display devices. For example, in the case of a panel PAN where one side of the display region PAR is equal to 2.5 inch, the length of at least 2.5 inch is desirable, but the length which is shorter or longer than this value is also allowable. Hereinafter, with respect to the X direction, a single property-modified region TL is caused to correspond to a high-performance circuit region CC equivalent to a single panel PAN. With respect to the Y direction, the overlapping is established in a predetermined over-lapped-region width OL, thereby ensuring a necessary circuit located-region width. Otherwise, it is also allowable to locate the property-modified regions TL with a predetermined spacing (e.g., 5-µm-or-less less spacing) placed therebetween. The location like this is implemented by intermittently time-modulating ON/OFF of the continuous-wave laser using the modulator, e.g., EO modulator or AO modulator or the like.

The relationship between the applied voltage (i.e., control voltage) to the EO or AO modulator and the laser-light output in terms of time axis is set such that, as illustrated in the waveform diagram in FIG. 12C, the laser is turned OFF when the applied voltage is high (Von), and the laser is turned ON when the applied voltage is low. Incidentally, transverse axis in FIG. 12C is the time t, and longitudinal axis in upper waveform diagram is the applied voltage (control voltage) to the EO or AO modulator, and longitudinal axis in lower waveform diagram is the laser-light output. Making the setting in this way reduces damage to the modulator, and permits low-noise state at OFF time to be used for the laser annealing. Since spacing between the panels PAN is small in comparison with length of the high-performance circuit region CC, a time during which the laser is ON is longer than a time during which the laser is OFF. Consequently, ratio (Ton/Toff) between ON-time and OFF-time of the voltage to the modulator becomes equal to 0.1 or less.

Here, current direction of the thin film transistor, or direction connecting the source and the drain, is made parallel to the X direction of the property-modified regions TL. This processing makes performance of the transistor even higher, thus increasing current quantity flowing in the transistor. This is because the crystalline grain is composed of pseudo single-crystal extending long in the channel direction.

As having been explained in the present embodiment, as the laser light with which the substrate is irradiated, the laser light is used that is time-modulated by the modulator for emitting the incident continuous-wave laser after time-modulating the incident continuous-wave laser in correspondence with the control voltage. Moreover, as the modulator, the modulator is used which, if the control voltage is high, emits the incident continuous-wave laser after making intensity of the incident continuous-wave laser equal to zero or changing the intensity to a small value, and which, if the control voltage is low, emits the incident continuous-wave laser with almost no change made to the intensity of the incident continuous-wave laser. Furthermore, the substrate is irradiated with the laser light which is time-modulated by the modulator so that the pulse width on time basis will become longer than the pulse interval thereon. This irradiation allows execution of the annealing using the laser light with less damage to the modulator and less noise.

FIG. 13A, FIG. 13B, and FIG. 13C are explanatory diagrams for explaining arrangement of the high-quality crystallization regions according to the present invention. FIG. 13A, which corresponds to FIG. 10 and FIG. 11, illustrates the case where the property-modified regions TL are not overlapped with each other in the X direction and Y direction, but are arranged with predetermined spacings Xs and Ys placed. therebetween. On account of the heat diffusion to an unmelted semiconductor region making contact with a semiconductor thin film which has been irradiated with laser and melted already, peripheral region of the melted region is cooled faster than the central portion. This, in the peripheral region, causes the crystal growth to develop with a certain angle to the X direction, thus deteriorating the transistor characteristics as well. Size of this region is denoted by Yd. This size Yd changes in a manner of being dependent on beam power, scanning velocity, and beam width. As an example, FIG. 13B illustrates scanning-velocity dependence of Yd. In FIG. 13B, transverse axis is the scanning velocity Vs (m/s), and longitudinal axis is diffusion distance (μm) of the heat from edge. Since the diffusion distance of heat from edge changes in a manner of being dependent on $1/\sqrt{}$ of the scanning velocity Vs, Yd also changes in basically the same way. As illustrated in FIG. 13C, the size of the region Yd exhibits $\sqrt{}$ dependence on the power, $1/\sqrt{}$ dependence on the scanning velocity Vs, and $\sqrt{}$ dependence on the beam width W as well.

Meanwhile, regarding the X direction, there exist the following characteristics: Namely, the lateral crystal is characterized by configuration of terminal end of the property-modified region TL. The terminal end of the property-modified region TL is formed in a region on which the laser-beam irradiation is turned OFF, or in a terminal-end region of the island-shaped semiconductor in the case where the semiconductor thin film machined in the island-shaped manner is irradiated with the laser light. In this region, there occurs a line-shaped protrusion (hereinafter, referred to as "terminal-end protrusion") whose height is higher than 50 nm. The reason for occurrence of the terminal-end protrusion is as follows: When the laser beam is cut off, in the region on which the laser-beam irradiation is turned OFF, or in the terminal-end region machined in the island-shaped manner, the crystal grows not only in crystal-growth direction generated by the laser-light irradiation and scanning, but also in a direction opposite to the crystal-growth direction. This situation causes collision to occur here. Since the protrusion is large in this region, it is impossible to locate the thin film transistors therein. Representing width of the region by Xe in FIG. 13A, Xe exhibits proportion dependence on the power, inverse-proportion dependence on the scanning velocity Vs, and proportion dependence on the beam width W. The region indicated above by Yd and Xe becomes a cause which increases variations in the thin film transistors. Accordingly, it is advisable that the channel be not located in the region.

Additionally, the contents explained in the present embodiment exhibit basically the same tendency not only in the case where the laser-light irradiation is performed without machining the precursor film PRE in advance like FIG. 10, but also in the case where the laser-light irradiation is performed after machining the precursor film PRE in advance in the island-shaped or line-shaped manner like FIG. 11. However, the case where patterning of the precursor film PRE is performed in advance like FIG. 11 exhibits a tendency that Yd becomes larger. Consequently, it is preferable to select the method in FIG. 10.

As having been described above, according to the present invention, the amorphous-silicon or polysilicon film of the precursor is property-modified to larger crystal. Then, the layout of the crystal-growth direction makes it possible to reduce probability with which the current between source and drain cuts across the grain boundary. As a consequence, it becomes possible to enhance operation speed of the thin film transistors and thereby to acquire the best thin film transistor circuits. Furthermore, the thin film transistor circuits using semiconductor thin film of the substantially belt-shaped crystal silicon film can be located in driving circuit portion of an image display device. Performances of the thin film transistors acquired in the present embodiment are as follows: When fabricating, e.g., an N-channel MIS transistor, the electric-field effect mobility is equal to 300 $cm^2/Vs$ or more, and variation in threshold-value voltage can be suppressed down to ±0.2 V or less. Accordingly, it becomes possible to manufacture an image display device using an active-matrix substrate which operates with a high performance and high reliability, and which is excellent in uniformity among devices.

Here, the following image display device is preferable: There are provided, on the substrate, pixels located in a matrix-like configuration, and a scanning-line driving circuit and a signal-line driving circuit for matrix-driving the pixels. In addition, at least the signal-line driving circuit includes the thin film transistor where the semiconductor thin film of the substantially belt-shaped crystal is used as the channel. Also, there may be provided, on the substrate, a circuit other than the pixels and the scanning-line driving circuit and the signal-line driving circuit, the circuit including a thin film transistor where the semiconductor thin film of the substantially belt-shaped crystal is used as a channel. Also, this semiconductor thin film can be used in the thin film transistors configuring the pixels and the scanning-line driving circuit.

There are provided, on one and the same substrate, first thin film transistors configuring a pixel region, second thin film transistors configuring a signal-line driving circuit, third film transistors configuring a scanning-line driving circuit, and fourth thin film transistors configuring the other circuits. In addition, at least the second and fourth thin film transistors include, as the channel, the semiconductor thin film having the lateral crystal indicated in the present embodiment.

Also, the present invention is applicable to a liquid-crystal display device where there are provided an opposed substrate located oppositely to the substrate with a predetermined spacing placed therebetween, and liquid crystal sealed in between the substrate and the opposed substrate. Otherwise, the present invention is also applicable to an organic EL display device where the substrate has an organic EL layer.

Next, based on a manufacturing method referring to FIG. 14A, FIG. 14B, and FIG. 14C to FIG. 19, the explanation will be given below concerning the embodiment of the image display device according to the present invention. In the manufacturing method which will be explained here, manufacturing a CMOS thin film transistor is selected as the example. An N-type thin film transistor is formed by self-consistent GOLDD (Gate Overlapped Light Doped Drain), and a P-type thin film transistor is formed by counter dope.

FIG. 14A, FIG. 14B, and FIG. 14C to FIG. 19 illustrate a series of manufacturing processes. In accordance with FIG. 14A, FIG. 14B, and FIG. 14C to FIG. 19, these series of manufacturing processes will be explained below.

Figure 14A:
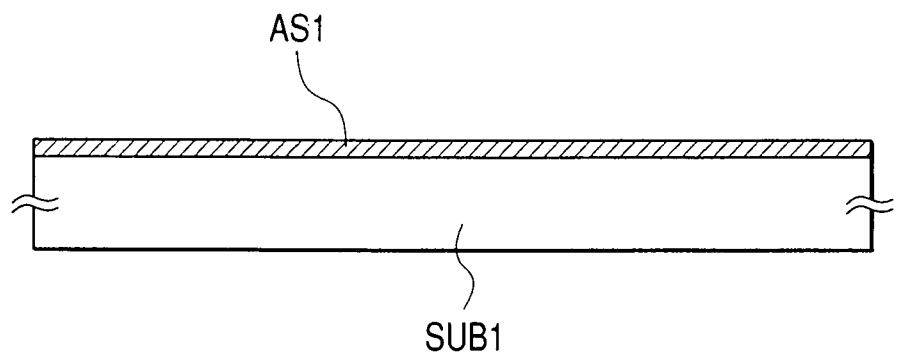
FIG. 14A, FIG. 14B, and FIG. 14C are processing-step diagrams for explaining an embodiment of a manufacturing method for manufacturing an image display device according to the present invention.

FIG. 14A: First, as an insulating substrate which becomes an active-matrix substrate, a 0.3-mm to 1.0-mm-thick heatresistant glass substrate SUB1 is prepared. Preferably, this glass substrate SUB1 exhibits comparatively small deformation and contraction when it is subjected to a 400° C. to 600° C. heat treatment. Preferably, on this glass substrate SUB1, an about 140-nm-thick SiN film and an about 100-nm-thick $SiO_2$ film, which function as thermal and chemical barrier films, are deposited continuously and uniformly by a CVD method. Then, an amorphous-silicon film ASI is formed on this glass substrate SUB1 by the CVD method or the like.

Figure 14B:
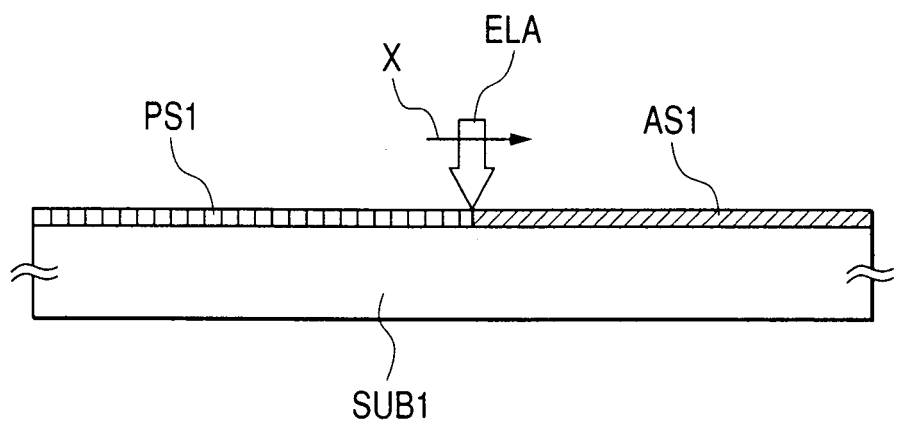

FIG. 14B: Next, excimer laser light ELA is scanned in an X direction so as to melt and crystallize the amorphous-silicon film ASI, thereby property-modifying the entire amorphous-silicon film ASI on the glass substrate SUB1 to a polycrystal silicon film, i.e., a polysilicon film PSI.

Incidentally, in substitution for the excimer laser light ELA, the other methods can be employed, e.g., the crystallization by solid pulse-laser annealing, and Cat-CVD film or SiGe film which becomes the polysilicon film at the time of silicon-film formation.

Figure 14C:
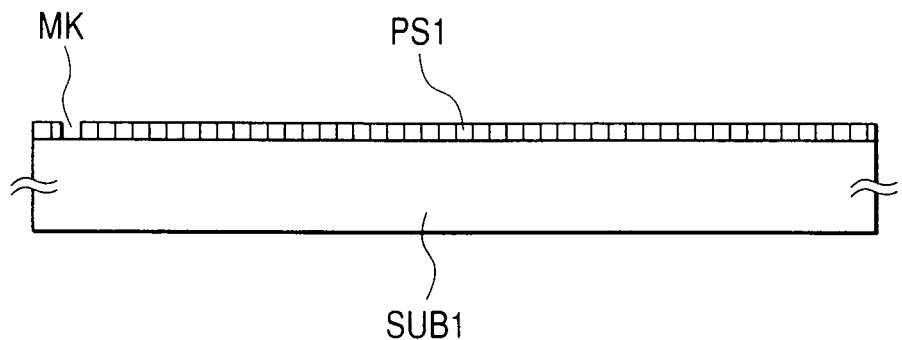

FIG. 14C: Taking advantage of laser annealing, a positioning mark MK is formed which becomes a target for laser-irradiation positioning or the like of laser light SXL such as pulse modulation laser which will be described later (Additionally, here, the explanation will be given assuming that pulse-width modulation laser is used).

Figure 15A:
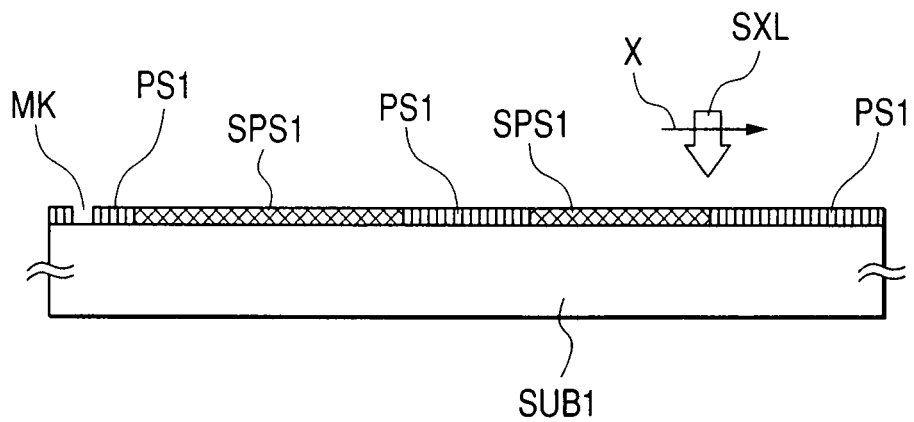
FIG. 15A, FIG. 15B, and FIG. 15C are processing-step diagrams subsequent to FIG. 14A, FIG. 14B, and FIG. 14C for explaining the embodiment of the manufacturing method for manufacturing the image display device according to the present invention.

FIG. 15A: The laser irradiation is executed uncontinuously while referring to the mark MK, scanning the pulse modulation laser-light SXL in the X direction, and selecting predetermined regions. The execution of this selective irradiation property-modifies the polysilicon film PSI, thereby forming substantially belt-shaped crystal silicon films SPSI (i.e., property-modified regions) which have continuous grain boundary in the scanning direction. Incidentally, in the drawing, the two substantially belt-shaped crystal silicon films SPSI are formed by dividing the crystal silicon film SPSI on each thin-film-transistor basis. It is also allowable, however, that a single substantially belt-shaped crystal silicon film SPSI be formed beforehand without making the division, and that the patterning be performed afterwards.

Figure 15B:
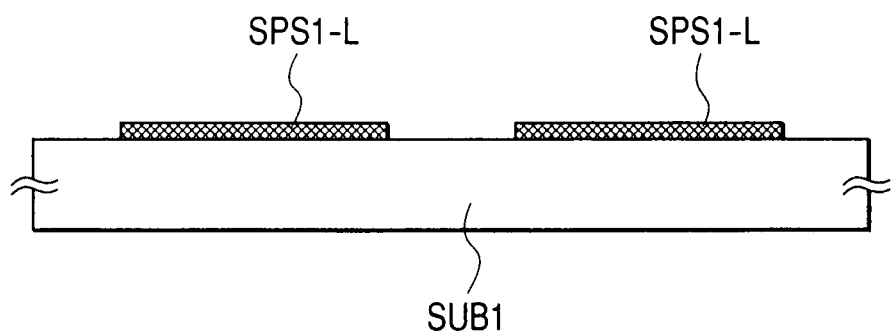

FIG. 15B: Taking advantage of a photolithography method, the substantially belt-shaped crystal silicon films SPSI are machined, thereby forming islands SPSI-L into which the thin film transistor is to be fabricated and integrated.

Figure 15C:
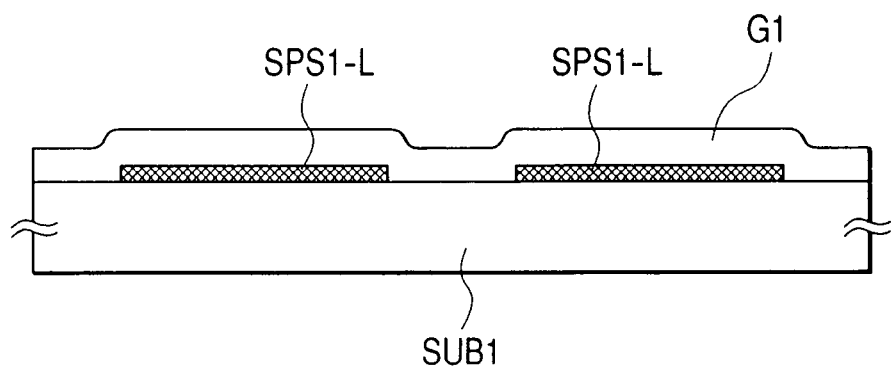

FIG. 15C: The islands SPSI-L of the substantially belt-shaped crystal silicon films SPSI are covered so as to form a gate insulating film GI.

Figure 16A:
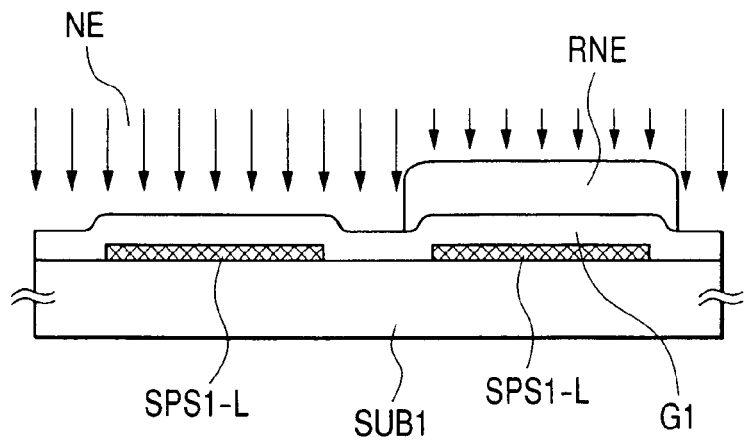
FIG. 16A, FIG. 16B, and FIG. 16C are processing-step diagrams subsequent to FIG. 15A, FIG. 15B, and FIG. 15C for explaining the embodiment of the manufacturing method for manufacturing the image display device according to the present invention.

FIG. 16A: Implantation NE for controlling a threshold value is performed to a region where an N-type thin film transistor is to be formed. At this time, a region where a P-type thin film transistor is to be formed is covered by photoresist RNE.

Figure 16B:
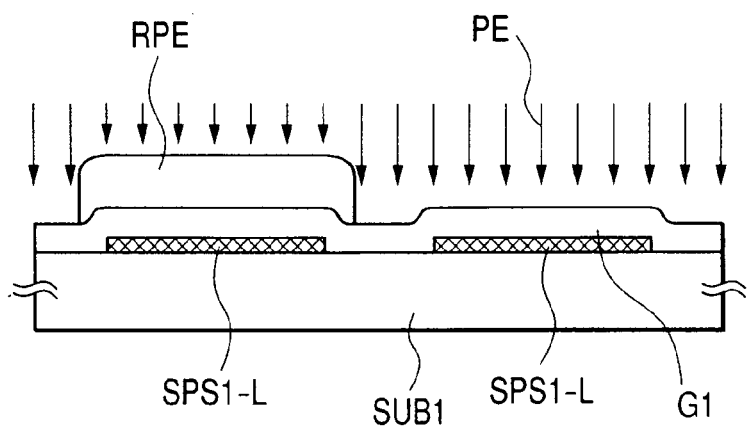

FIG. 16B: Next, implantation PE for controlling a threshold value is performed to the region where the P-type thin film transistor is to be formed. At this time, the region where the N-type thin film transistor is to be formed is covered by photoresist RPE.

Figure 16C:
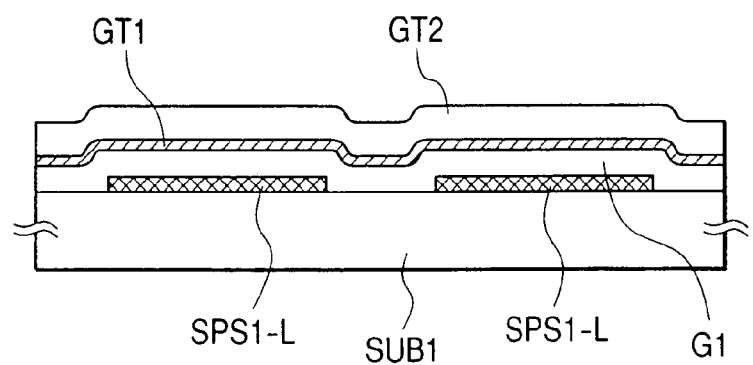

FIG. 16C: On this, using a spattering method or CVD method., two-layers-formed metallic gate films GT1 and GT2 are formed which become a gate electrode of the thin film transistor.

Figure 17A:
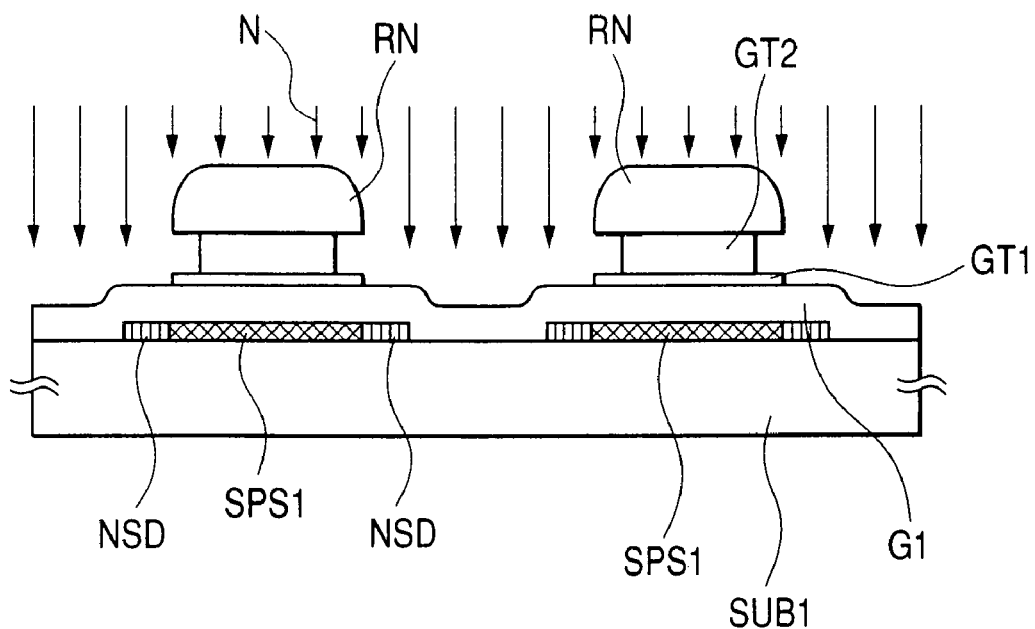
FIG. 17A and FIG. 17B are processing-step diagrams subsequent to FIG. 16A, FIG. 16B, and FIG. 16C for explaining the embodiment of the manufacturing method for manufacturing the image display device according to the present invention.

FIG. 17A: A formation region of the metallic gate films GT1 and GT2 is covered by photoresist RN. Then, patterning the metallic gate films GT1 and GT2 is performed by a photolithography method. At this time, in order to form a LDD region, the upper-layer metallic gate film GT2 is side-etched by a necessary amount, thereby causing the film GT2 to retreat in comparison with the lower-layer metallic gate film GT1. In this state, implantation of N-type impurity N is performed with the photoresist RN as the mask, thereby forming source/drain regions NSD of the N-type thin film transistor.

Figure 17B:
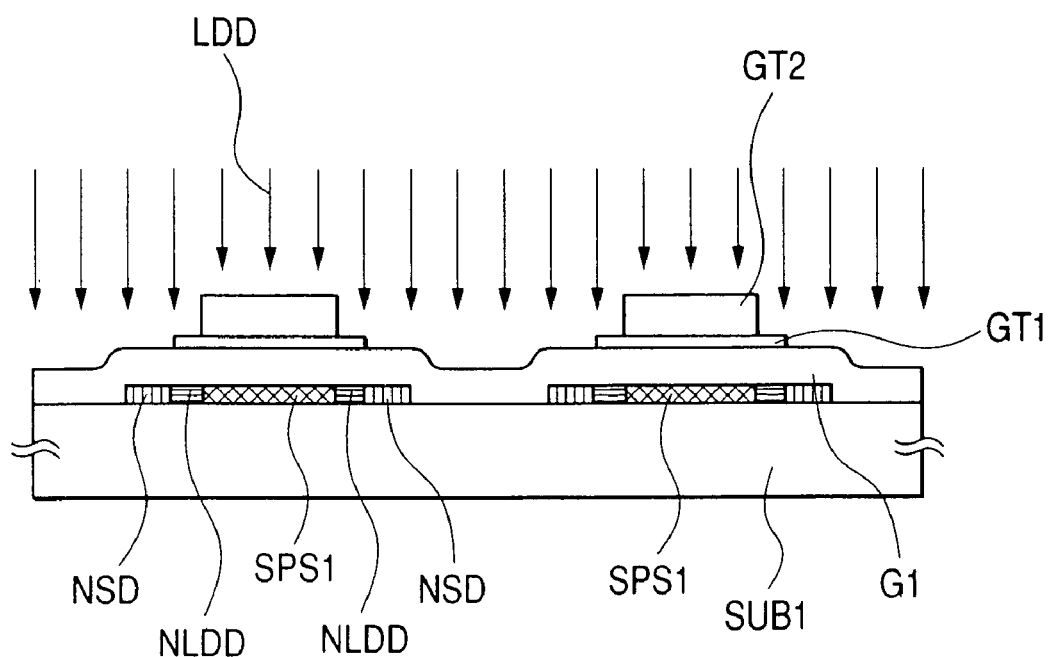

FIG. 17B: The photoresist RN is flaked off, and implantation LDD is performed with the metallic gate film GT2 as the mask, thereby forming the LDD region NLDD of the N-type thin film transistor.

Figure 18A:
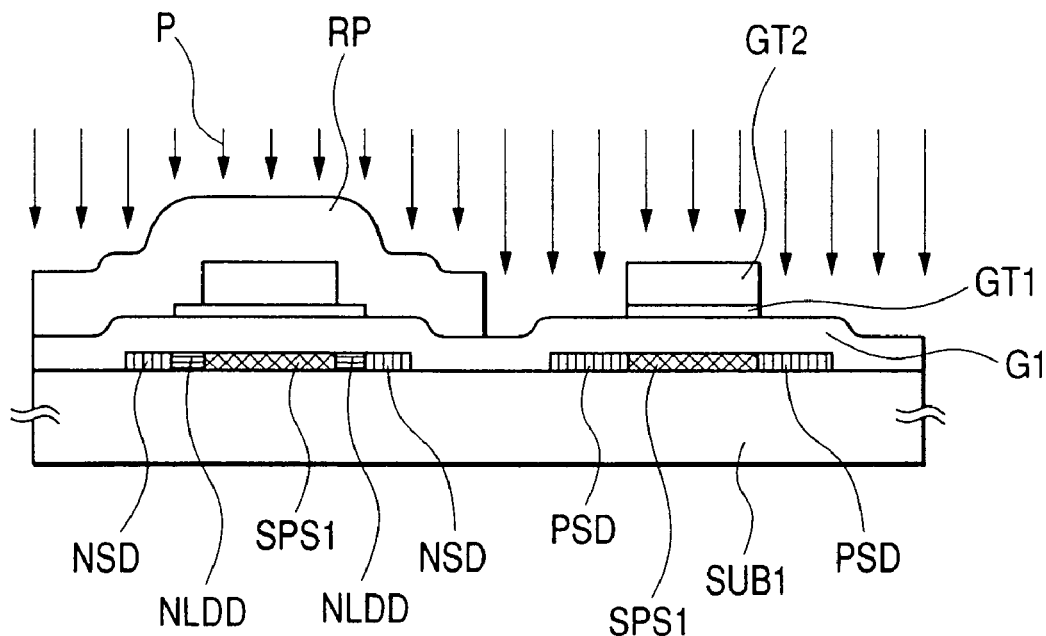
FIG. 18A and FIG. 18B are processing-step diagrams subsequent to FIG. 17A and FIG. 17B for explaining the embodiment of the manufacturing method for manufacturing the image display device according to the present invention.

FIG. 18A: The formation region of the N-type thin film transistor is covered by photoresist RP. Then, implantation of P-type impurity P is performed into the source/drain formation region of the P-type thin film transistor, thereby forming source/drain regions PSD of the P-type thin film transistor.

Figure 18B:
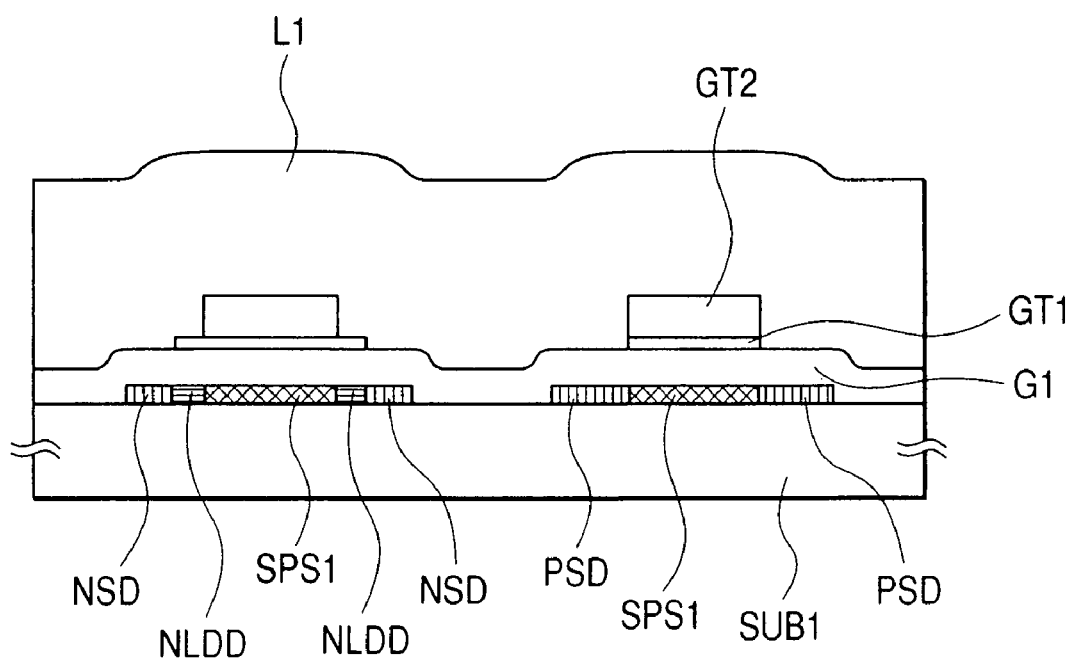

FIG. 18B: The photoresist RP is flaked off, and the impurity by the implantation is activated. After that, an inter-layer insulating film LI is formed by a CVD method or the like.

Figure 19:
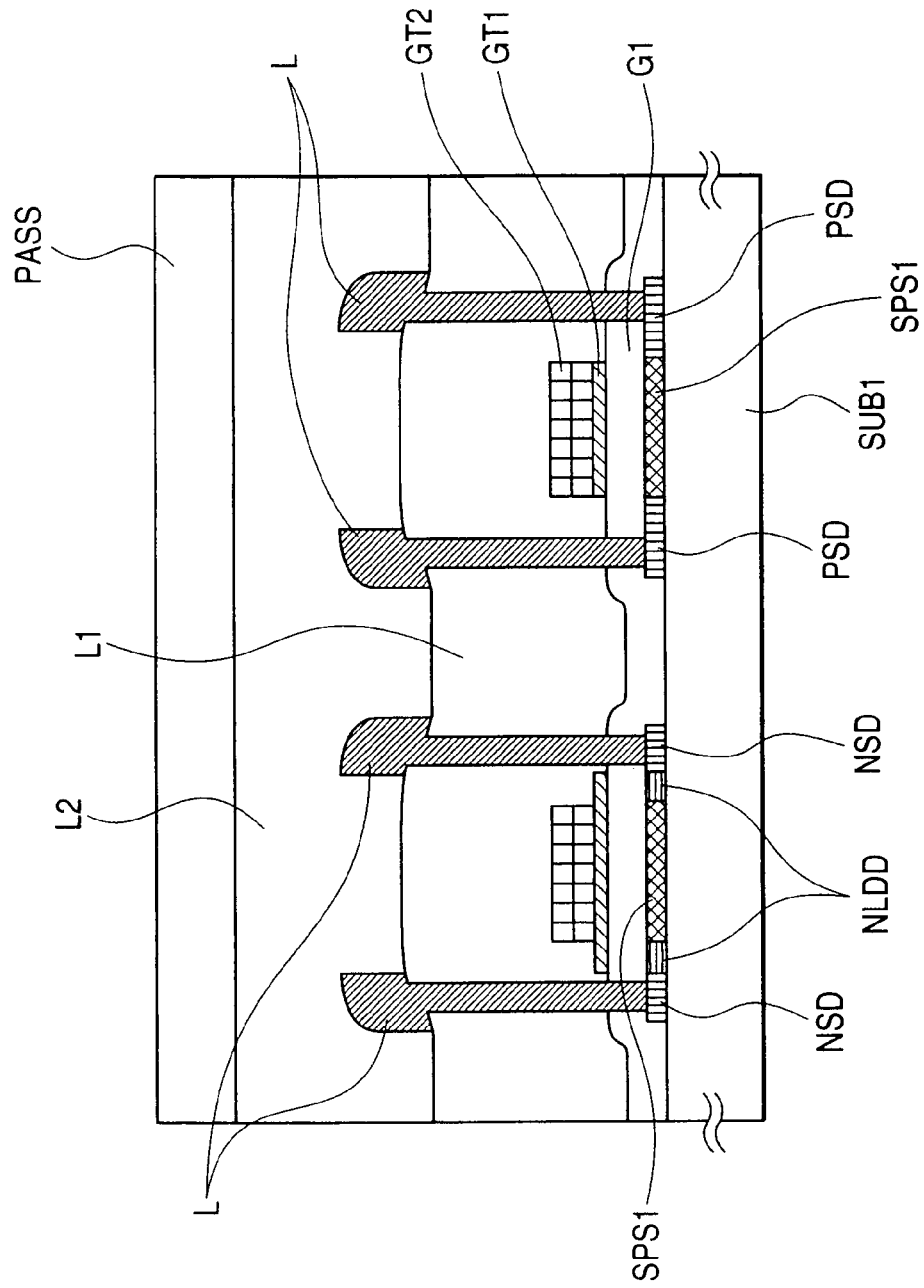
FIG. 19 is a plan view of an organic EL display device where the configuration components illustrated in FIG. 18A and FIG. 18B are integrated.

FIG. 19: A contact hole is formed in the inter-layer insulating film LI and the gate insulating film GI by a photolithography method. Then, metallic layers for wiring are connected via this contact hole to the source/drain NSD of the N-type thin film transistor and the source/drain PSD of the P-type thin film transistor, thereby forming wirings L. Moreover, an inter-layer insulating film L2 is formed on the wirings L, and further, a protection insulating film PASS is formed.

FIG. 25 is a plan view for illustrating an embodiment of the thin film transistor according to the present invention. As illustrated in FIG. 25, grain boundary CB existing between single-crystals of substantially belt-shaped crystal silicon film of silicon island exists in substantially the same direction as crystalline direction CGR. Source electrode SD1 and drain electrode SD2 are each formed at positions opposed to this crystalline direction CGR. Direction of current (i.e., channel current) Ich which flows between the source electrode SD1 and the drain electrode SD2 is set to direction substantially parallel to the crystalline direction CGR. In this way, the crystalline direction CGR and the direction of the current Ich are made identical to each other. This makes it possible to increase mobility of electrons in the channel.

The above-described processing steps form the CMOS thin film transistor on the substantially belt-shaped crystal silicon films SPSI. Incidentally, in general, the N-type thin film transistor exhibits tremendous degradation. The formation of the low-concentration impurity region LDD (Light Doped Drain region) between the channel and the source/drain region allows relaxation of this degradation. The GOLDD has a structure that the low-concentration impurity region is covered with the gate electrode. In this case, the performance degradation observed in the LDD is relaxed. In the P-type thin film transistor, its degradation is not so serious as the N-type thin film transistor. Accordingly, the low-concentration impurity region LDD or GOLDD is not usually employed therein. Although, in the present embodiment, the GOLDD structure has been employed, employment of single-drain structure or the LDD structure also allows acquisition of basically the same effects.

Figure 20:
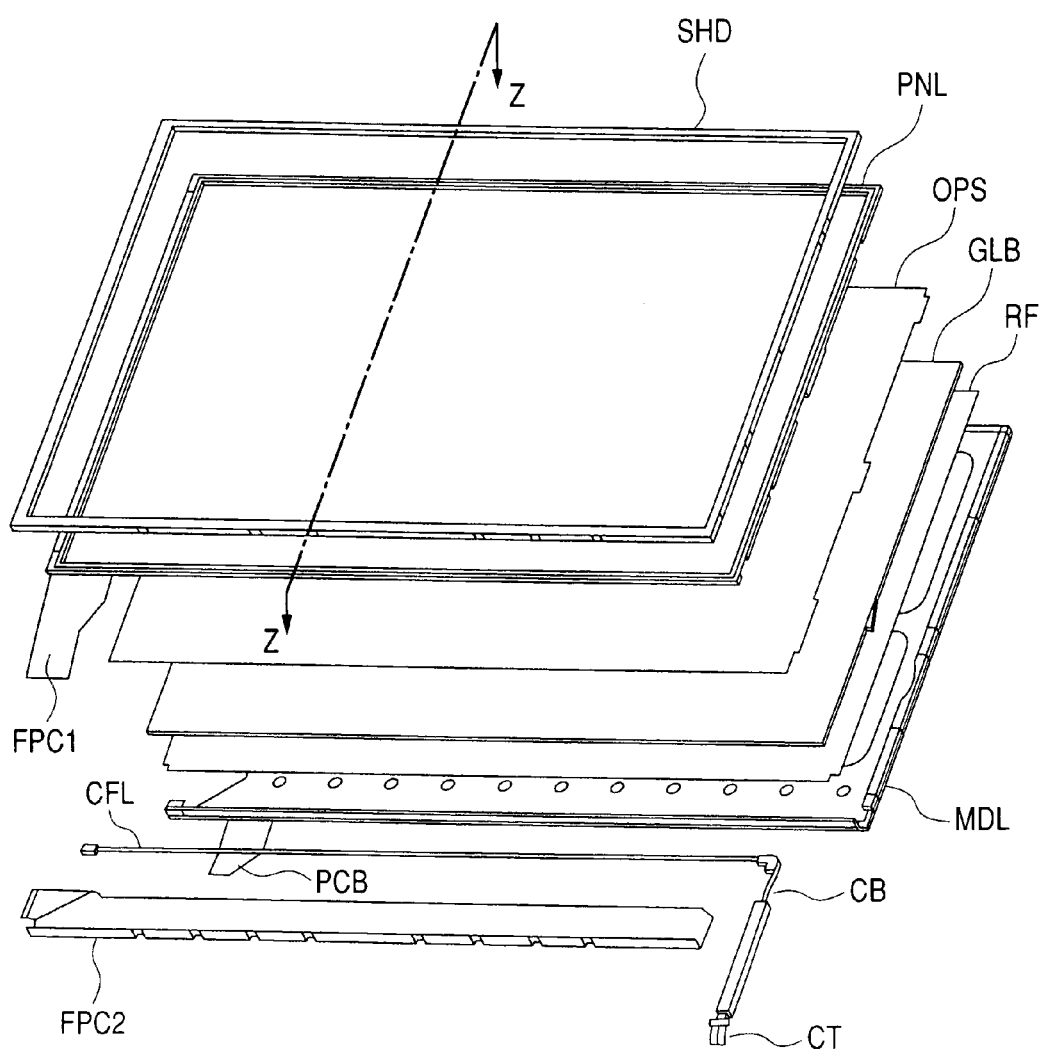
FIG. 20 is an expanded perspective view for explaining the configuration of a liquid-crystal display device as a first embodiment of the image display device according to the present invention.
Figure 21:
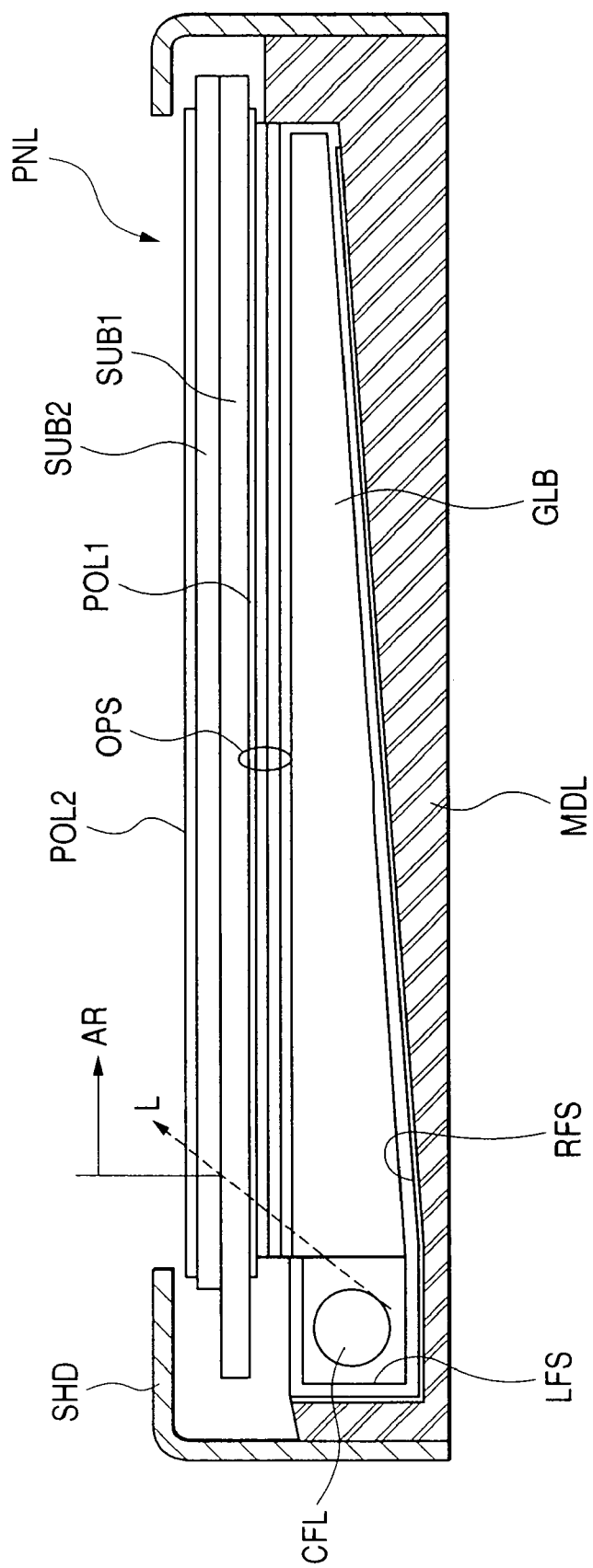
FIG. 21 is a cross-sectional view resulting from cutting off the configuration in FIG. 20 in the Z-Z line direction.

FIG. 20 is an expanded perspective view for explaining the configuration of a liquid-crystal display device as a first embodiment of the image display device according to the present invention. Also, FIG. 21 is a cross-sectional view resulting from cutting off the configuration in FIG. 20 in the Z-Z line direction. This liquid-crystal display device is manufactured using the active-matrix substrate described earlier. In FIG. 20 and FIG. 21, a reference numeral PNL denotes liquid-crystal cells where liquid crystal is sealed in a pasted clearance between an active-matrix substrate SUB1 and an opposed substrate SUB2. Polarization plates POL1 and POL2 are multilayered on the front and rear sides of the liquid-crystal cells PNL. Also, a reference numeral OPS denotes an optical compensation member including a diffusion sheet or prism sheet, GLB denotes a light-guiding plate, CFL denotes a cold-cathode fluorescent lamp, RFS denotes a reflection sheet, LFS denotes a lamp reflection sheet, SHD denotes a shield frame, and MDL denotes a mold case.

A liquid-crystal orientation film layer is formed on the active-matrix substrate SUB1 having any one of the configurations of the embodiments described earlier. Next, an orientation-regulating force is given to this liquid-crystal orientation film layer by using techniques such as rubbing. Then, after forming a sealing agent on the periphery of a pixel region AR, the opposed substrate SUB2 on which an orientation film layer has been similarly formed is located oppositely to the active-matrix substrate with a predetermined gap placed therebetween. Moreover, the liquid crystal is sealed into this gap, then blocking a sealing opening of the sealing agent with a sealing member. Furthermore, the polarization plates POL1 and POL2 are multilayered on the front and rear sides of the liquid-crystal cells PNL configured in this way. In addition, a backlight or the like including the light-guiding plate GLB and the cold-cathode fluorescent lamp CFL is implemented via the optical compensation member OPS. Additionally, to a driving circuit existing on the periphery of the liquid-crystal cells, data and a timing signal are supplied via flexible print substrates FPC1 and FPC2. A reference numeral PCB denotes a timing controller or the like which, between an external signal source and the respective flexible print substrates FPC1 and FPC2, transforms a display signal inputted from the external signal source to a signal form displayed in the liquid-crystal display device.

In the liquid-crystal display device using the active-matrix substrate of the present embodiment, the above-described excellent polysilicon thin film transistor circuits are located in the pixel circuit thereof. As a consequence, the liquid-crystal display device is excellent in current driving capability, and accordingly is suitable for high-speed operation. Furthermore, variation in threshold-value voltage is small. This results in a characteristic of being capable of providing an inexpensive liquid-crystal display device which is excellent in uniformity of picture quality.

Figure 22:
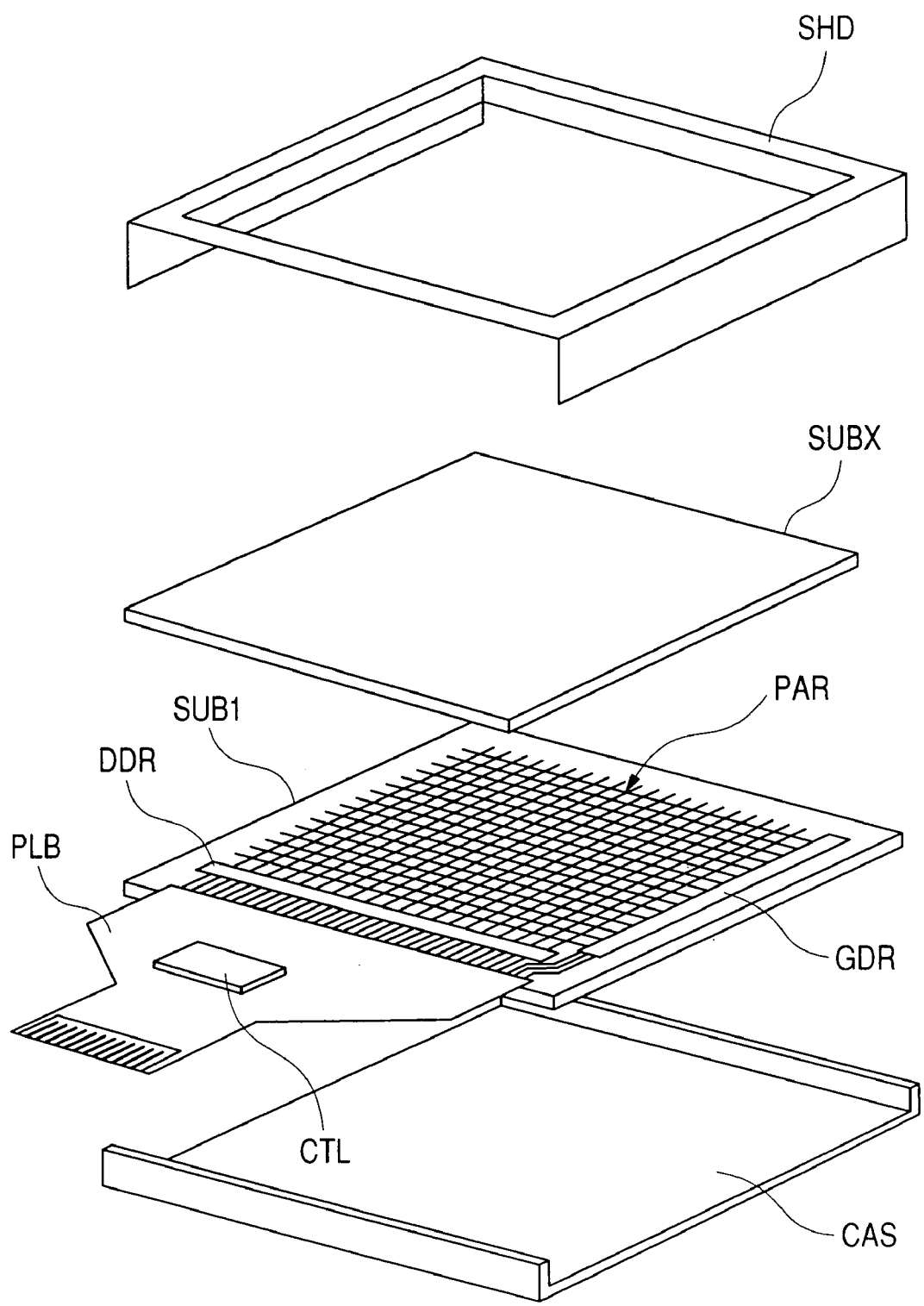
FIG. 22 is an expanded perspective view for explaining the configuration of an organic EL display device as a second embodiment of the image display device according to the present invention.
Figure 23:
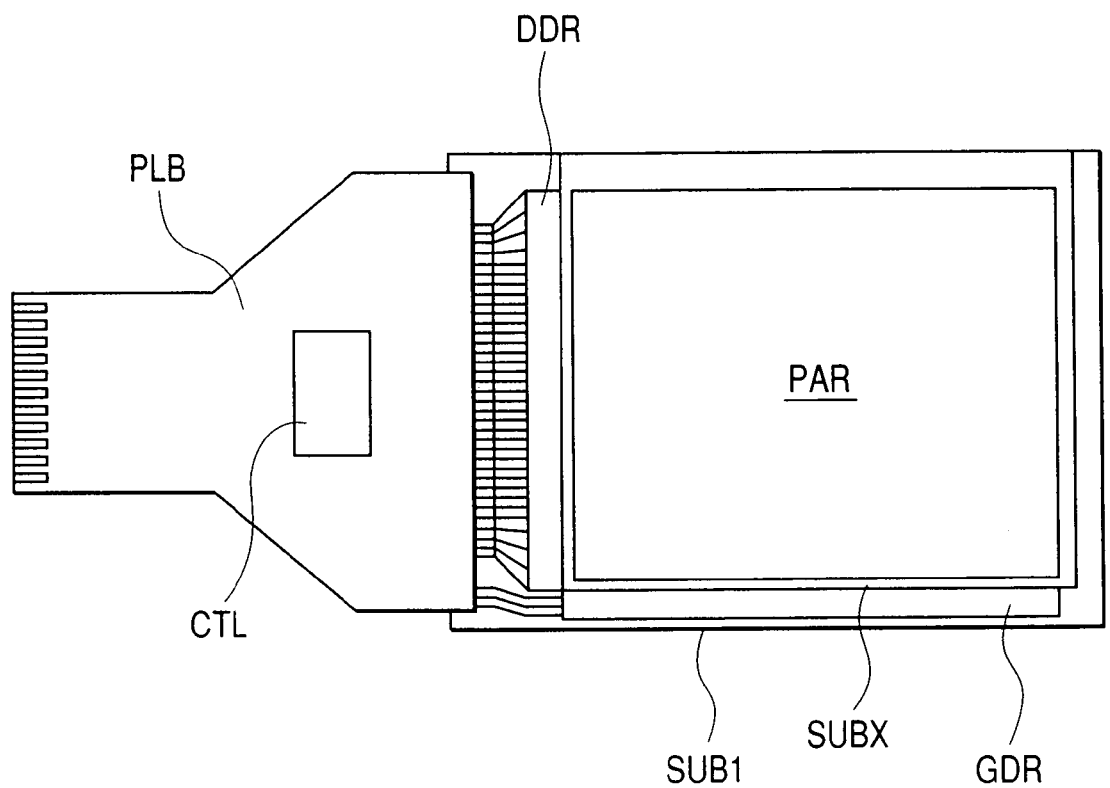
FIG. 23 is a plan view of the organic EL display device where the configuration components illustrated in FIG. 22 are integrated.

Also, the use of the active-matrix substrate of the present embodiment makes it possible to manufacture an organic EL display device. FIG. 22 is an expanded perspective view for explaining the configuration of an organic EL display device as a second embodiment of the image display device according to the present invention. Also, FIG. 23 is a plan view of the organic EL display device where the configuration components illustrated in FIG. 22 are integrated. An organic EL element is formed on an electrode within a pixel provided on any one of the active-matrix substrates SUB1 of the respective embodiments described earlier. The organic EL element includes a multilayered component in which, starting from the electrode surface within the pixel in sequence, a hole transportation layer, a light-emitting layer, an electron transportation layer, and a cathode metallic layer are evaporated. Moreover, a sealing member is located on the periphery of a pixel region PAR of the active-matrix substrates SUB1 on which the multilayered layer like this has been formed, and sealing is performed with a sealing substrate SUBX or a sealing can. Also, instead of these, a protection film may be used.

In this organic EL display device, a display signal from an external signal source is supplied to its driving circuit regions DDR and GDR by a print substrate PLB. An interface circuit chip CTL is mounted on this print substrate PLB. In addition, a shield frame SHD, i.e., an upper-side case, and a lower-side case CAS are integrated with each other, which configures and defines the organic EL display device.

In the active-matrix driving for the organic EL display device, the organic EL elements are based on current driving light-emitting scheme. As a result, employment of high-performance pixel circuit is absolutely necessary for providing high-quality images. Consequently, it is desirable to use pixel circuit including the CMOS-type thin film transistors. Also, thin film transistor circuit formed in driving circuit region is also absolutely necessary for high-speed and high-resolution implementation. The active-matrix substrate SUB1 of the present embodiment has high performances which satisfy the requirements like this. The organic EL display device using the active-matrix substrate manufactured by the manufacturing method of the present embodiment is one of the display devices which exhibit the characteristics of the present embodiment up to the largest and highest possible degree.

The semiconductor thin film manufacturing method according to the present invention is not limited to the above-described active-matrix substrate of the image display devices. Also, the manufacturing method according to the present invention is not limited to configuration which will be disclosed in the claims, and the configuration described in the embodiments. Conversely, various modifications are possible without departing from the technical idea and spirit of the present invention. For example, the manufacturing method is also applicable to manufacturing of various types of semiconductor devices.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An image display device, comprising a thin film transistor where a semiconductor thin film of a substantially belt-shaped crystal is used as a channel;
    wherein said substantially belt-shaped crystal is crystallized by scanning laser light or a substrate to irradiate said laser light onto an arbitrary region of said semiconductor thin film and performing a laser irradiation thereon, said substantially belt-shaped crystal being crystallized such that crystalline grains grow in said scanning direction, said semiconductor thin film being formed on said substrate,
    wherein, on XY coordinates where value x of beam size W (μm) of said laser light measured in substantially the same direction as said scanning direction is defined as X axis, and where value y of scanning velocity Vs (m/s) is defined as Y axis, said crystallization processing is performed within a region where all of the following (condition 1), (condition 2), and (condition 3) hold,
    (condition 1) said beam size W is larger than wavelength of said laser beam,
    (condition 2) said scanning velocity Vs is smaller than upper-limit of crystal growth speed, and
    (condition 3) x×(1/y)<25 μs.

2. The image display device according to claim 1, wherein there are provided, on said substrate, pixels located in a matrix-like configuration, and a scanning-line driving circuit and a signal-line driving circuit for matrix-driving said pixels,
    at least said signal-line driving circuit having said thin film transistor where said semiconductor thin film of said substantially belt-shaped crystal is used as said channel.

3. The image display device according to claim 2, wherein there is provided, on said substrate, a circuit other than said pixels and said scanning-line driving circuit and said signal-line driving circuit, said circuit having a thin film transistor where said semiconductor thin film of said substantially belt-shaped crystal is used as a channel.

4. The image display device according to claim 1, wherein there are provided an opposed substrate located opposedly to said substrate with a predetermined spacing placed therebetween, and liquid crystal sealed in between said substrate and said opposed substrate.

5. The image display device according to claim 1, wherein said substrate has an organic EL layer.

* * * * *